US012396379B2

(12) United States Patent
Park et al.

(10) Patent No.: US 12,396,379 B2
(45) Date of Patent: Aug. 19, 2025

(54) SEMICONDUCTOR DEVICES

(71) Applicant: SAMSUNG ELECTRONICS CO., LTD., Suwon-si (KR)

(72) Inventors: Changyup Park, Hwaseong-si (KR); Dongho Ahn, Suwon-si (KR); Donggeon Gu, Hwaseong-si (KR); Wonjun Park, Hwaseong-si (KR); Jinwoo Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 445 days.

(21) Appl. No.: 17/938,200

(22) Filed: Oct. 5, 2022

(65) Prior Publication Data

US 2023/0165174 A1    May 25, 2023

(30) Foreign Application Priority Data

Nov. 23, 2021    (KR) .................. 10-2021-0161873

(51) Int. Cl.
*H10N 70/00*    (2023.01)
*H10B 63/00*    (2023.01)
*H10N 70/20*    (2023.01)

(52) U.S. Cl.
CPC ........... *H10N 70/861* (2023.02); *H10B 63/34* (2023.02); *H10N 70/231* (2023.02);
(Continued)

(58) Field of Classification Search
CPC .............. H10N 70/861; H10N 70/231; H10N 70/8265; H10N 70/841; H10N 70/8828;
(Continued)

(56) References Cited

U.S. PATENT DOCUMENTS 8,035,157 B2    10/2011  Lee
9,059,395 B2     6/2015  Ju et al.
(Continued)

FOREIGN PATENT DOCUMENTS

KR         10-0831390        5/2008
KR      10-2016-0117854 A   10/2016

OTHER PUBLICATIONS

Office Action dated May 21, 2025 issued in corresponding Korean Patent Application No. 10-2021-0161873.

*Primary Examiner* — Allison Bernstein
(74) *Attorney, Agent, or Firm* — MORGAN, LEWIS & BOCKIUS LLP

(57) ABSTRACT

A semiconductor device includes gate electrodes on a substrate, a channel and a resistance pattern. The gate electrodes are spaced apart from each other in a vertical direction substantially perpendicular to an upper surface of the substrate. The channel extends through the gate electrodes in the vertical direction on the substrate. The resistance pattern includes a phase-changeable material. The resistance pattern includes a first vertical extension portion on a sidewall of the channel and extending in the vertical direction, a first protrusion portion on an inner sidewall of the first vertical extension portion and protruding in a horizontal direction substantially parallel to the upper surface of the substrate, and a second protrusion portion on an outer sidewall of the first vertical extension portion and protruding in the horizontal direction and not overlapping the first protrusion portion in the horizontal direction.

20 Claims, 26 Drawing Sheets

(52) U.S. Cl.
CPC ....... *H10N 70/8265* (2023.02); *H10N 70/841* (2023.02); *H10N 70/8828* (2023.02)

(58) Field of Classification Search
CPC ............... H10N 70/011; H10N 70/823; H10N 70/8825; H10N 70/882; H10B 63/34; H10B 63/10; H10B 63/845; H10B 20/20; H10B 20/60; H10B 69/00
See application file for complete search history.

(56) References Cited

U.S. PATENT DOCUMENTS

| | | |
|---|---|---|
| 9,076,958 B2 | 7/2015 | Ahn |
| 9,450,023 B1 * | 9/2016 | Konevecki ......... H10N 70/8265 |
| 10,141,372 B2 | 11/2018 | Park et al. |
| 2014/0145137 A1 * | 5/2014 | Ju ..................... H10N 70/8833 |
| | | 257/2 |
| 2015/0054058 A1 | 2/2015 | Seol et al. |
| 2020/0343307 A1 | 10/2020 | Lee et al. |
| 2020/0395412 A1 | 12/2020 | Lee et al. |
| 2021/0074914 A1 | 3/2021 | Lee et al. |
| 2021/0082955 A1 | 3/2021 | Rajashekhar et al. |
| 2023/0389338 A1 * | 11/2023 | Kang ................... H10B 63/845 |

\* cited by examiner

SEMICONDUCTOR DEVICES

CROSS-REFERENCE TO RELATED APPLICATIONS

This application claims priority under 35 U.S.C. § 119 to Korean Patent Application No. 10-2021-0161873, filed on Nov. 23, 2021, in the Korean Intellectual Property Office (KIPO), the contents of which are herein incorporated by reference in their entirety.

TECHNICAL FIELD

The present inventive concept relates to a semiconductor device, more particularly, to a vertical memory device.

DISCUSSION OF RELATED ART

As the demand for a semiconductor device to have high-capacity in data storage increases, the number of stacks of memory cells increases. At the same time, as the integration degree of the semiconductor device increases, the distance between the memory cells decreases.

The writing operation of the semiconductor device is performed by changing the resistance of a selected memory cell among a plurality of memory cells to store data in the selected memory cell. Due to the reduced distance between the memory cells, the Joule's heat provided to the selected memory cell may be transferred to an adjacent non-selected memory cell to change the resistance of the adjacent non-selected memory cell, and thus the data may also be stored in the adjacent non-selected memory cell. Accordingly, the writing operation of the semiconductor device may deteriorate.

SUMMARY

Example embodiments provide a semiconductor device having enhanced characteristics.

According to an example embodiment of the present inventive concept, there is provided a semiconductor device. The semiconductor device may include gate electrodes on a substrate, a channel and a resistance pattern. The gate electrodes may be spaced apart from each other in a vertical direction substantially perpendicular to an upper surface of the substrate. The channel may extend through the gate electrodes in the vertical direction on the substrate. The resistance pattern may include a phase-changeable material. The resistance pattern may include a first vertical extension portion on a sidewall of the channel and extending in the vertical direction, a first protrusion portion on an inner sidewall of the first vertical extension portion and protruding in a horizontal direction substantially parallel to the upper surface of the substrate, and a second protrusion portion on an outer sidewall of the first vertical extension portion and protruding in the horizontal direction and not overlapping the first protrusion portion in the horizontal direction.

According to an example embodiment of the present inventive concept, there is provided a semiconductor device. The semiconductor device may include gate electrodes on a substrate, insulation patterns between the gate electrodes, respectively, and a memory channel structure extending through the gate electrodes and the insulation patterns. The gate electrodes may be spaced apart from each other in a vertical direction substantially perpendicular to an upper surface of the substrate. The memory channel structure may extend in the vertical direction on the substrate. The memory channel structure may include a filling pattern extending in the vertical direction, a resistance pattern on a sidewall of the filling pattern and extending in the vertical direction, and a channel on a sidewall of the resistance pattern and extending in the vertical direction. A width of the memory channel structure in a horizontal direction substantially parallel to the upper surface of the substrate may vary periodically in the vertical direction. A first portion of the resistance pattern facing a corresponding one of the gate electrodes in the horizontal direction may have a width substantially equal to a width of a second portion of the resistance pattern facing a corresponding one of the insulation patterns in the horizontal direction.

According to an example embodiment of the present inventive concept, there is provided a semiconductor device. The semiconductor device may include a lower circuit pattern on a substrate, a common source plate (CSP) over the lower circuit pattern, gate electrodes spaced apart from each other on the CSP in a vertical direction substantially perpendicular to an upper surface of the substrate, insulation patterns between the gate electrodes, respectively, and a memory channel structure extending through the gate electrodes and the insulation patterns in the vertical direction on the CSP. The memory channel structure may include a filling pattern extending in the vertical direction, a resistance pattern on a sidewall of the filling pattern and extending in the vertical direction, and a channel on a sidewall of the resistance pattern and extending in the vertical direction. A width of the memory channel structure in a horizontal direction substantially parallel to the upper surface of the substrate may vary periodically in the vertical direction. A portion of the resistance pattern facing a corresponding one of the gate electrodes in the horizontal direction may have a width substantially equal to a width of a portion of the resistance pattern facing a corresponding one of the insulation patterns in the horizontal direction.

In the writing operation of the semiconductor device in accordance with example embodiments of the present inventive concept, Joule's heat provided to the resistance pattern may have an enlarged transfer route, and thus the writing operation of the semiconductor device may be enhanced.

BRIEF DESCRIPTION OF THE DRAWINGS

The above and other aspects and features of the present inventive concept will be more clearly understood from the following detailed description, taken in conjunction with the accompanying drawings, in which.

Figure 1:
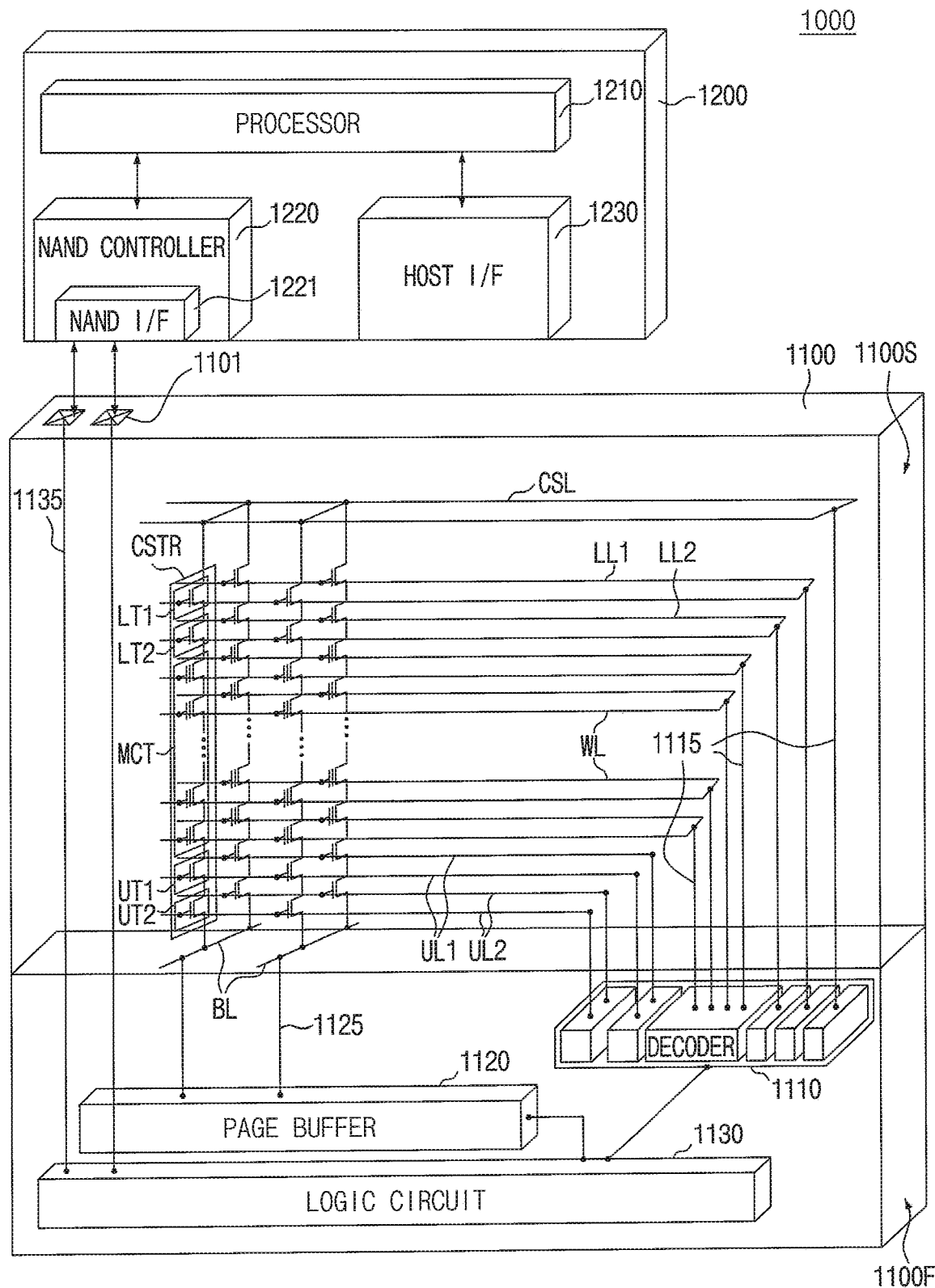
FIG. 1 is a schematic diagram illustrating an electronic system including a semiconductor device in accordance with an example embodiment of the present inventive concept.

Since the drawings in FIGS. 1-26 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

The above and other aspects and features of a semiconductor device, a method of manufacturing the semiconductor device, and an electronic system including the semiconductor device in accordance with example embodiments will become readily understood from detail descriptions that follow, with reference to the accompanying drawings.

FIG. 1 is a schematic diagram illustrating an electronic system including a semiconductor device in accordance with an example embodiment of the present inventive concept.

Referring to FIG. 1, an electronic system 1000 may include a semiconductor device 1100 and a controller 1200 electrically connected to the semiconductor device 1100. The electronic system 1000 may be a storage device including one or a plurality of semiconductor devices 1100, or an electronic device including a storage device. For example, the electronic system 1000 may be and/or be included in, for example, a solid state drive (SSD) device, a universal serial bus (USB), a computing system, a medical device, and/or a communication device that may include one or a plurality of semiconductor devices 1100.

The semiconductor device 1100 may be a non-volatile memory device, for example, a NAND flash memory device that will be illustrated with reference to FIGS. 4 to 26. The semiconductor device 1100 may include a first structure 1100F and a second structure 1100S on the first structure 1100F. In the drawing, the first structure 1100F is under the second structure 1100S, however, the present inventive concept is not limited thereto. For example, the first structure 1100F may be beside and/or on the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second upper gate lines UL1 and UL2, first and second lower gate lines LL1 and LL2, and memory cell strings CSTR disposed between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with an example embodiment of the present inventive concept.

In an example embodiment of the present inventive concept, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In an example embodiment of the present inventive concept, the lower transistors LT1 and LT2 may include a lower erase control transistor LT1 and a ground selection transistor LT2 that may be connected with each other in serial. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection wirings 1115 extending from the first structure 1100F to the second structure 1110S. The bit lines BL may be electrically connected to the page buffer 1120 through second connection wirings 1125 extending from the first structure 1100F to the second structure 1100S.

In the first structure 1100F, the decoder circuit 1110 and the page buffer 1120 may perform a control operation for at least one selected memory cell transistor among the plurality of memory cell transistors MCT. The decoder circuit 1110 and the page buffer 1120 may be controlled by the logic circuit 1130. Each of the decoder circuit 1110, the page buffer 1120 and the logic circuit 1130 may include a plurality of circuit devices. Each of the circuit devices may include, for example, but is not limited to, a transistor. The semiconductor device 1100 may communicate with the controller 1200 through an input/output pad 1101 electrically connected to the logic circuit 1130. The input/output pad 1101 may be electrically connected to the logic circuit 1130 through an input/output connection wiring 1135 extending from the first structure 1100F to the second structure 1100S.

The controller 1200 may include a processor 1210, a NAND controller 1220, and a host interface (HOST I/F) 1230. The electronic system 1000 may include a plurality of semiconductor devices 1100, and in this case, the controller 1200 may control the plurality of semiconductor devices 1100.

The processor 1210 may control operations of the electronic system 1000 including the controller 1200. The processor 1210 may be operated by firmware, and may control the NAND controller 1220 to access the semiconductor device 1100. The NAND controller 1220 may include a NAND interface (NAND I/F) 1221 for communicating with the semiconductor device 1100. Through the NAND interface (NAND I/F) 1221, control command for controlling the semiconductor device 1100, data to be written in the memory cell transistors MCT of the semiconductor device 1100, data to be read from the memory cell transistors MCT of the semiconductor device 1100, etc., may be transferred. The host interface (HOST I/F) 1230 may provide communication between the electronic system 1000 and an outside host. When control command is received from the outside host through the host interface (HOST I/F) 1230, the processor 1210 may control the semiconductor device 1100 in response to the control command.

Figure 2:
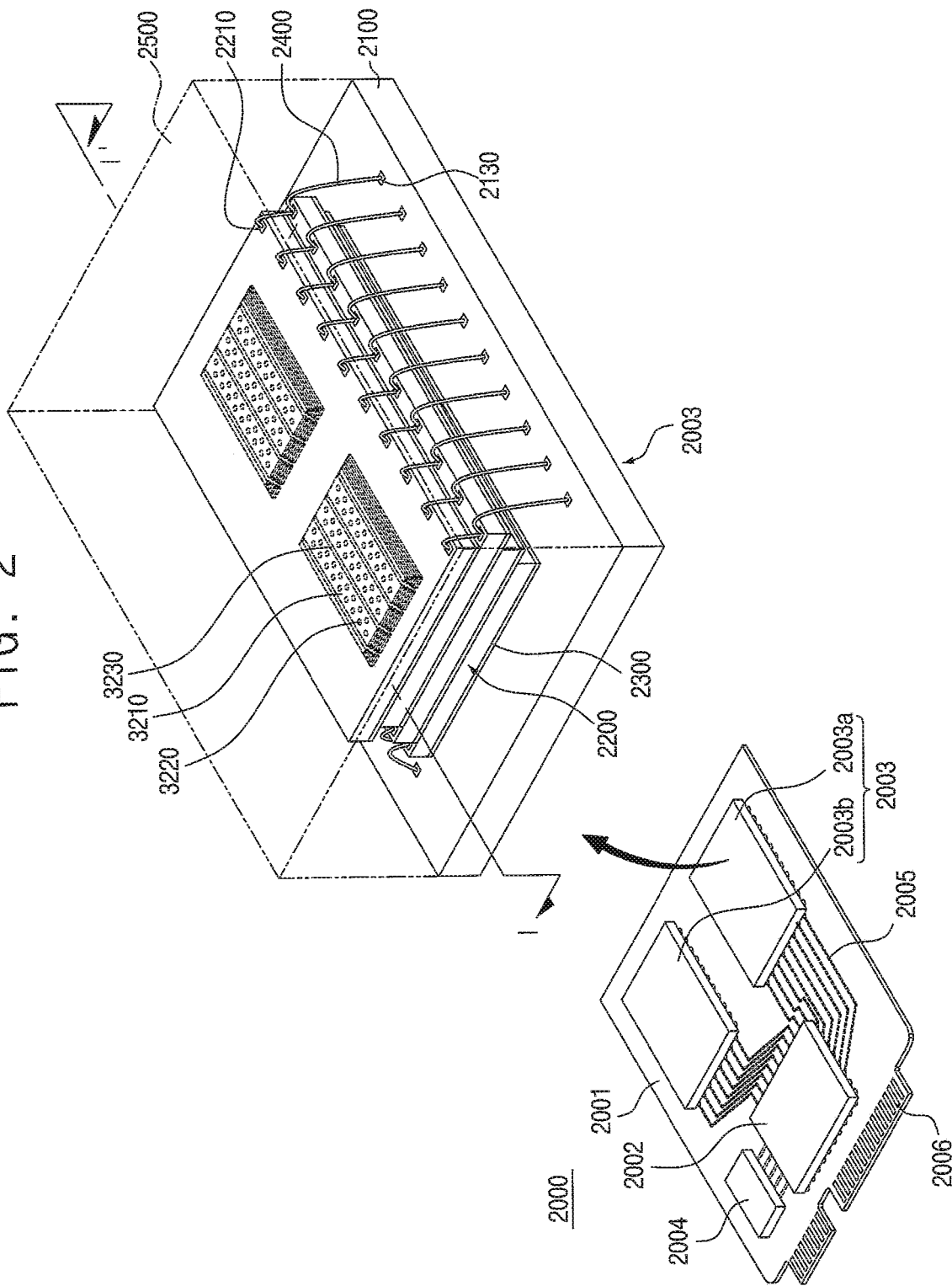
FIG. 2 is a schematic perspective view illustrating an electronic system including a semiconductor device in accordance with an example embodiment of the present inventive concept.

FIG. 2 is a schematic perspective view illustrating an electronic system including a semiconductor device in accordance with an example embodiment of the present inventive concept.

Referring to FIG. 2, an electronic system 2000 may include a main substrate 2001, a controller 2002 mounted on the main substrate 2001, at least one semiconductor package 2003, and a dynamic random access memory (DRAM) device 2004. The semiconductor package 2003 and the DRAM device 2004 may be connected to the controller 2002 by wiring patterns 2005 formed on the main substrate 2001.

The main substrate 2001 may include a connector 2006 having a plurality of pins connected to an outside host. The number and layout of the plurality pins in the connector 2006 may be changed depending on a communication interface between the electronic system 2000 and an outside host. In an example embodiment of the present inventive concept, the electronic system 2000 may communicate with the outside host according to one of, for example, a USB, peripheral component interconnect express (PCI-Express), serial advanced technology attachment (SATA), M-Phy for universal flash storage (UFS), etc. In an example embodiment of the present inventive concept, the electronic system 2000 may be operated by power source provided from the outside host through the connector 2006. The electronic system 2000 may further include power management integrated circuit (PMIC) for distributing the power source provided from the outside host to the controller 2002 and the semiconductor package 2003.

The controller 2002 may write data in the semiconductor package 2003 and/or read data from the semiconductor package 2003, and may enhance the operation speed of the electronic system 2000.

The DRAM device 2004 may be a buffer memory for reducing the speed difference between the semiconductor package 2003, which is a data storage space, and the outside host. The DRAM device 2004 included in the electronic system 2000 may serve as a cache memory, and may provide a space for temporarily storing data during the control operation for the semiconductor package 2003. If the electronic system 2000 includes the DRAM device 2004, the controller 2002 may further include a DRAM controller for controlling the DRAM device 2004 in addition to the NAND controller for controlling the semiconductor package 2003.

The semiconductor package 2003 may include first and second semiconductor packages 2003a and 2003b spaced apart from each other. The first and second semiconductor packages 2003a and 2003b may be semiconductor packages each of which may include a plurality of semiconductor chips 2200. Each of the first and second semiconductor packages 2003a and 2003b may include a package substrate 2100, the semiconductor chips 2200 disposed on the package substrate 2100, bonding layers 2300 disposed under the semiconductor chips 2200, a connection structure 2400 for electrically connecting the semiconductor chips 2200 and the package substrate 2100, and a mold layer 2500 covering the semiconductor chips 2200 and the connection structure 2400 on the package substrate 2100. Though only the first and second semiconductor packages 2003a and 2003b are illustrated, the number of the semiconductor packages is not so limited, and the electronic system 2000 may include more or fewer semiconductor packages.

The package substrate 2100 may be, for example, a printed circuit board (PCB) including package upper pads 2130. Each semiconductor chip 2200 may include at least one input/output pad 2210. The at least one input/output pad 2210 may correspond to the input/output pad 1101 of FIG. 1. Each semiconductor chip 2200 may include gate electrode structures 3210, memory channel structures 3220 extending through the gate electrode structures 3210, and division structures 3230 for dividing the gate electrode structures 3210. Each semiconductor chip 2200 may include a semiconductor device that will be illustrated with reference to FIGS. 4 to 26.

In an example embodiment of the present inventive concept, the connection structure 2400 may be a bonding wire for electrically connecting the input/output pad 2210 and the package upper pads 2130. For example, in each of the first and second semiconductor packages 2003a and 2003b, the semiconductor chips 2200 may be electrically connected with each other by a bonding wire method, and may be electrically connected to the package upper pads 2130 of the package substrate 2100. Alternatively, in each of the first and second semiconductor packages 2003a and 2003b, the semiconductor chips 2200 may be electrically connected with each other by a connection structure including a through silicon via (TSV), instead of the connection structure 2400 in the bonding wire method.

In an example embodiment of the present inventive concept, the controller 2002 and the semiconductor chips 2200 may be included in one package. In an example embodiment of the present inventive concept, the controller 2002 and the semiconductor chips 2200 may be mounted on an interposer substrate different from the main substrate 2001, and the controller 2002 and the semiconductor chips 2200 may be connected with each other by a wiring formed on the interposer substrate.

Figure 3:
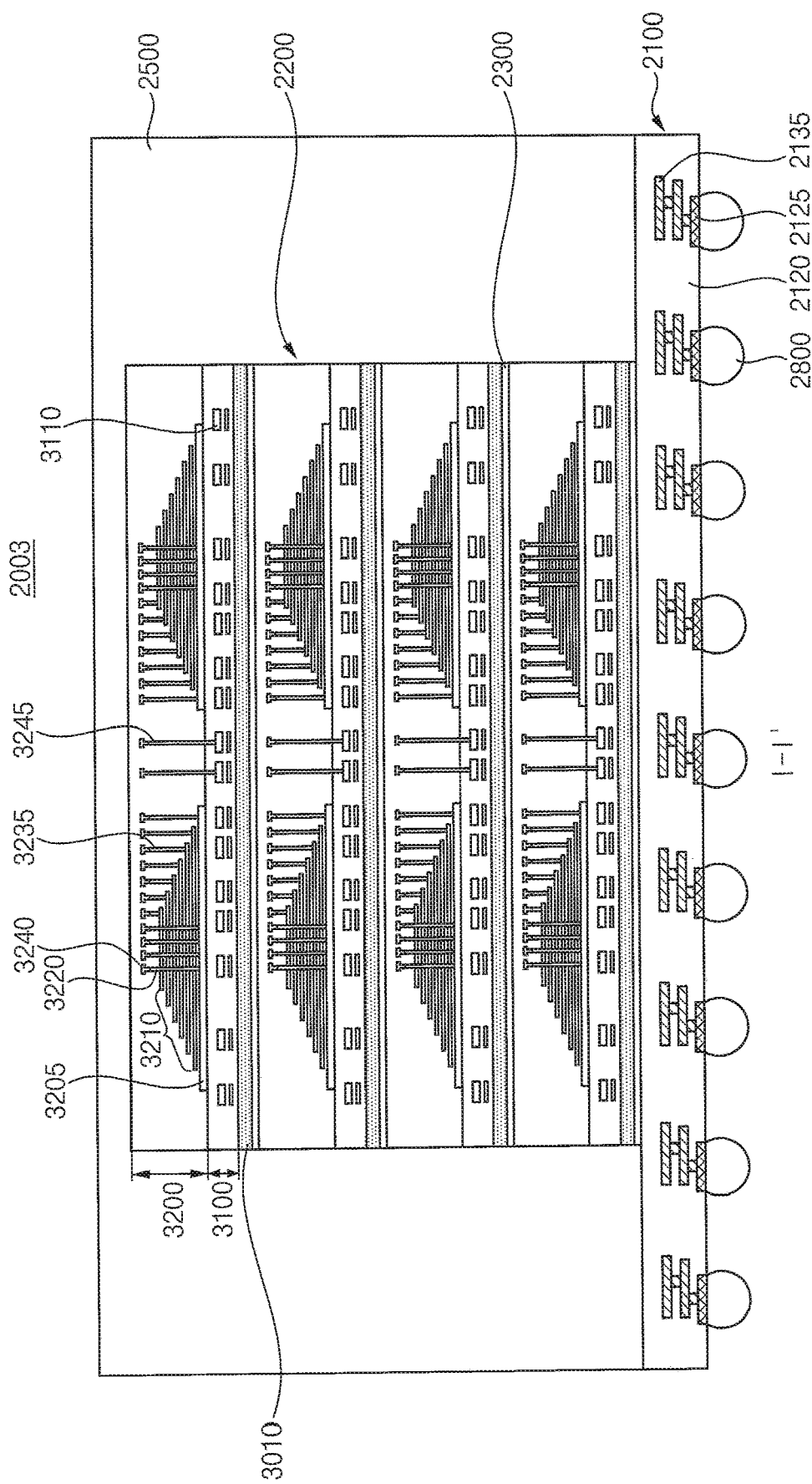
FIG. 3 is a schematic cross-sectional view illustrating a semiconductor package including a semiconductor device in accordance with an example embodiment of the present inventive concept.

FIG. 3 is a schematic cross-sectional view illustrating a semiconductor package including a semiconductor device in accordance with an example embodiment of the present inventive concept. FIG. 3 illustrates an example of the semiconductor package 2003 shown in FIG. 2, and shows a cross-section taken along a line I-I' of the semiconductor package 2003 in FIG. 2.

Referring to FIG. 3, in the semiconductor package 2003, the package substrate 2100 may be a PCB. The package substrate 2100 may include a substrate body part 2120, the package upper pads 2130 (refer to FIG. 2) arranged on an upper surface of the substrate body part 2120, package lower pads 2125 arranged on or exposed through a lower surface of the substrate body part 2120, and inner wirings 2135 electrically connecting the package upper pads 2130 and the package lower pads 2125 in an inside of the substrate body part 2120. The package upper pads 2130 may be electrically connected to the connection structures 2400. The package lower pads 2125 may be connected to wiring patterns 2005 of the main substrate 2001 in the electronic system 2000 through conductive connection parts 2800, as shown in FIG. 2.

Each semiconductor chip 2200 may include a semiconductor substrate 3010, and a first structure 3100 and a second structure 3200 sequentially stacked on the semiconductor substrate 3010.

The first structure 3100 may include a peripheral circuit region in which peripheral circuit wirings 3110 may be formed. The second structure 3200 may include a common source line 3205, a gate electrode structure 3210 on the common source line 3205, memory channel structures 3220 and division structures 3230 (refer to FIG. 2) extending through the gate electrode structure 3210, bit lines 3240 electrically connected to the memory channel structures 3220, and gate connection wirings 3235 electrically connected to the word lines WL of the gate electrode structure 3210 (refer to FIG. 1).

Each semiconductor chip 2200 may include a through wiring 3245 being electrically connected to the peripheral circuit wirings 3110 of the first structure 3100 and extending into the second structure 3200. The through wiring 3245 may be disposed at an outside of the gate electrode structure 3210, and some through wirings 3245 may be disposed to extend through the gate electrode structure 3210.

Each semiconductor chip 2200 may further include the input/output pad 2210 (refer to FIG. 2) electrically connected to the peripheral circuit wirings 3110 of the first structure 3100.

Figure 4:
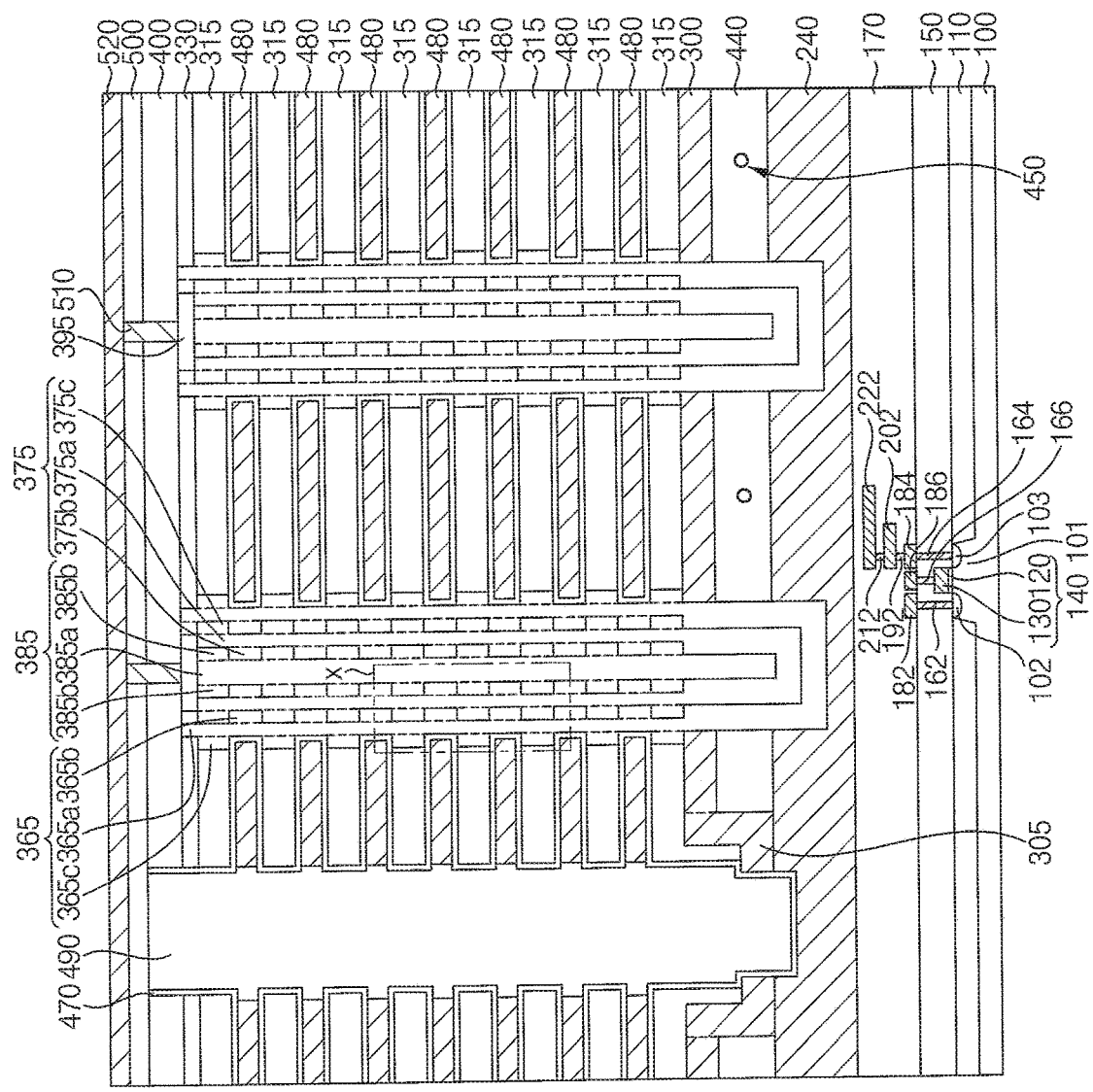
FIG. 4 is a cross-sectional view illustrating a semiconductor device in accordance with an example embodiment of the present inventive concept.
Figure 5:
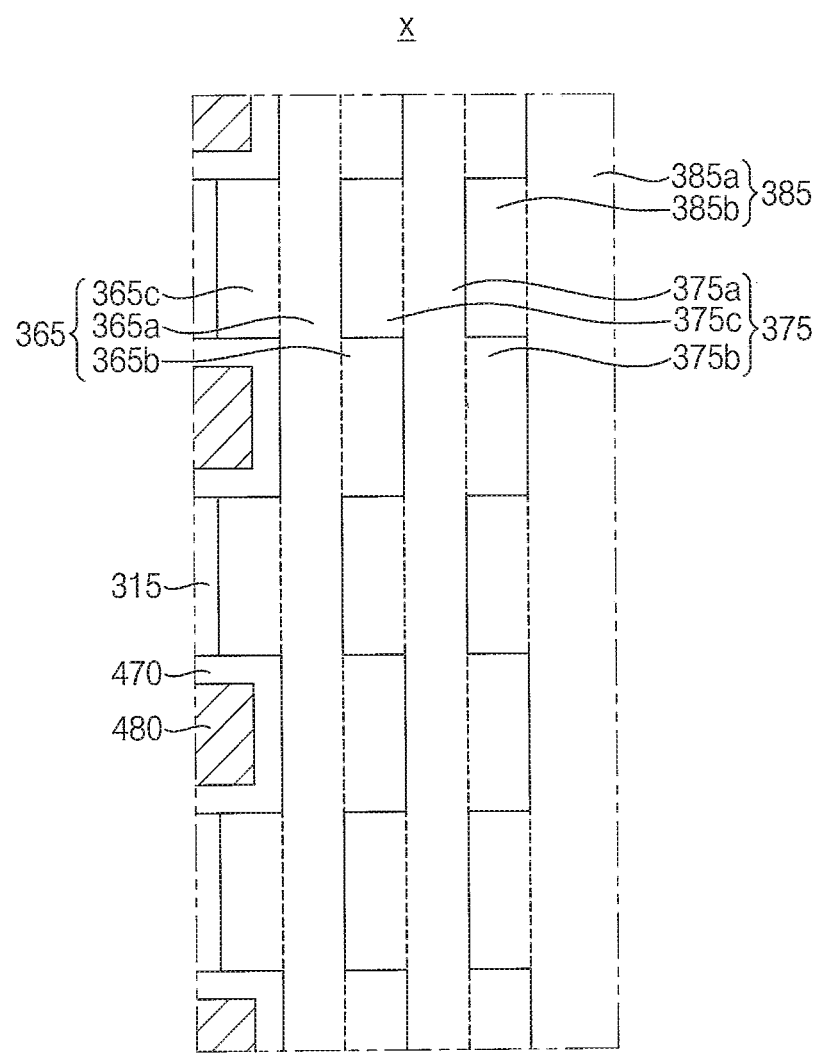
FIG. 5 is an enlarged cross-sectional view of region X in FIG. 4.

FIG. 4 is a cross-sectional view illustrating a semiconductor device in accordance with an example embodiment of the present inventive concept. FIG. 5 is an enlarged cross-sectional view of region X in FIG. 4.

This semiconductor device may correspond to the semiconductor device 1100 of FIG. 1 and the semiconductor chips 2200 of FIGS. 2 and 3.

Hereinafter, in the specifications (and not necessarily in the claims), a direction substantially perpendicular to an upper surface of a substrate may be referred to as a first direction D1, and two directions substantially parallel to the upper surface of the substrate and crossing each other may be referred to as second and third directions D2 and D3, respectively. In an example embodiment of the present inventive concept, the second and third directions D2 and D3 may be perpendicular with each other. In an example embodiment of the present inventive concept, the first direction D1 may be a vertical direction. In an example embodiment of the present inventive concept, the second and third directions D2 and D3 may each be a horizontal direction.

Referring to FIGS. 4 and 5, the semiconductor device may include a lower circuit pattern on a substrate 100, a common source plate (CSP) 240 over the lower circuit pattern, gate electrodes 480 spaced apart from each other in the first direction D1 on the CSP 240, insulation patterns 315 between neighboring ones of the gate electrodes 480, respectively, and a memory channel structure extending in the first direction D1 through the insulation patterns 315 and the gate electrodes 480 on the CSP 240. A plurality of memory channel structures may be formed in each of the second direction D2 and the third direction D3 to form a memory channel structure array. The semiconductor device may further include a support layer 300, a support pattern 305, a channel connection pattern 440, a blocking pattern 470, a division pattern 490, a contact plug 510, a bit line 520, and first to fifth insulating interlayers 150, 170, 330, 400 and 500.

The substrate 100 may include a field region on which an isolation pattern 110 is formed and an active region 101 on which no isolation pattern is formed. The active region 101 may be defined on the substrate 100 by the isolation pattern 110 filling a substrate trench. For example, the active region 101 may correspond to portions of the substrate 100 that are surrounded by the isolation pattern 110. The isolation pattern 110 may include an oxide, e.g., silicon oxide ($SiO_2$).

The substrate 100 may include silicon (Si), germanium (Ge), silicon-germanium (SiGe) or a III-V group compound such as gallium phosphide (GaP), gallium arsenide (GaAs), gallium antimonide (GaSb), indium arsenide (InAs), indium antimonide (InSb), lead tellurium (PbTe) compounds, indium phosphide (InP), or indium gallium arsenide (InGaAs), etc. In an example embodiment of the present inventive concept, the substrate 100 may be a silicon-on-insulator (SOI) substrate or a germanium-on-insulator (GOI) substrate. The substrate 100 may include a conductive area, for example, a well doped with impurities or a structure doped with impurities. In addition, the substrate 100 may include one or more semiconductor layers or structures and may include active or operable portions of semiconductor devices.

In an example embodiment of the present inventive concept, the semiconductor device may have a cell over periphery (COP) structure. That is, the lower circuit pattern may be formed on the substrate 100, and the lower circuit pattern may include, e.g., transistors, lower contact plugs, lower wirings, lower vias, etc.

The transistor may include a lower gate structure 140 on the substrate 100 and first and second impurity regions 102 and 103 at upper portions of the active region 101 adjacent to the lower gate structure 140 serving as source/drain regions. The first and second impurity regions 102 and 103 may each be a region doped with, for example, n-type impurities or p-type impurities. The lower gate structure 140 may include a lower gate insulation pattern 120 and a lower gate electrode 130 sequentially stacked on the substrate 100. A channel region may be formed in the active region 101 between the first and second impurity regions 102 and 103. The lower gate insulation pattern 120 may include at least one of, for example, a silicon oxide ($SiO_2$) layer, a silicon nitride ($Si_3N_4$) layer, a silicon oxynitride (SiON) layer, an oxide/nitride/oxide (ONO) layer, or a high-k dielectric layer having a dielectric constant greater than that of the silicon oxide ($SiO_2$) layer. The first insulating interlayer 150 may be formed on the substrate 100 to cover the transistors, and first and second lower contact plugs 162 and 164 extending through the first insulating interlayer 150 to contact the first and second impurity regions 102 and 103, respectively, and a third lower contact plug 166 extending in the first insulating interlayer 150 to contact the lower gate electrode 130 may be formed.

First to third lower wirings 182, 184 and 186 may be formed on the first insulating interlayer 150 to contact upper surfaces of the first to third lower contact plugs 162, 164 and 166, respectively. A first lower via 192, a fourth lower wiring 202, a second lower via 212 and a fifth lower wiring 222 may be sequentially stacked on the second lower wiring 184.

The second insulating interlayer 170 may be formed on the first insulating interlayer 150 to cover the first to fifth lower wirings 182, 184, 186, 202 and 222 and the first and second lower vias 192 and 212. The first and second insulating interlayers 150 and 170 may include an oxide, e.g., silicon oxide ($SiO_2$), and thus, in an example embodiment of the present inventive concept, the second insulating interlayer 170 may be merged with the first insulating interlayer 150.

The CSP 240 may include, e.g., polysilicon (p-Si) doped with n-type impurities. The n-type impurities may include, but not limited to, e.g., phosphorus (P), arsenic (As), or antimony (Sb) ions. Alternatively, the CSP 240 may include a metal silicide layer and a doped polysilicon (p-Si) layer sequentially stacked. The metal silicide layer may include, e.g., tungsten silicide ($WSi_2$).

The gate electrode 480 may extend in the second direction D2, and the gate electrodes 480 may be staked in a staircase shape in which extension lengths in the second direction D2 may gradually decrease in a stepwise manner from a lowermost level toward an uppermost level. However, the present inventive concept is not limited thereto. For example, in an example embodiment of the present inventive concept, the gate electrodes 480 may be staked in an upside down fashion of the stepwise shape, in which extension lengths in the second direction D2 may gradually increase from a lowermost level toward an uppermost level.

In an example embodiment of the present inventive concept, the gate electrodes 480 may include a ground selection line (GSL), a string selection line (SSL), and a word line. In an example embodiment of the present inventive concept, one of the gate electrodes 480 at a lowermost level may serve as the GSL, ones of the gate electrodes 480 at an uppermost level and a second level from above, respectively, may serve as the SSL, and ones of the gate electrodes 480 at a plurality of levels, respectively, between the GSL and the SSL may serve as the word lines, respectively. However, the numbers of levels at which the GSL, the SSL and the word lines are formed might not be limited to the above, and may be varied. In an example embodiment of the present inventive concept, one or a plurality of additional gate electrodes under the GSL and/or over the SSL may serve as a gate induced drain leakage (GIDL) electrode, which may use GIDL phenomenon to enable body erase. Some of the word lines may serve as dummy word lines.

Each of the gate electrodes 480 may include a conductive pattern and a barrier pattern covering lower and upper surfaces of the conductive pattern and a sidewall thereof. The conductive pattern may include a low resistance metal, e.g., tungsten (W), titanium (Ti), tantalum (Ta), platinum (Pt), etc., and the barrier pattern may include a metal nitride, e.g., titanium nitride (TiN), tantalum nitride (TaN), etc.

A blocking pattern 470 may cover lower and upper surfaces of the gate electrode 480 and a sidewall thereof facing a channel 365 or a resistance pattern 375. The blocking pattern 470 may include, e.g., a metal oxide, e.g., aluminum oxide ($Al_2O_3$), hafnium oxide ($HfO_2$), etc., and may also cover sidewalls of the insulation pattern 315, the support layer 300 and the channel connection pattern 440 and an upper surface of the CSP 240.

The insulation pattern 315 may be formed between neighboring ones of the gate electrodes 480 in the first direction D1, and the gate electrodes 480 and the insulation patterns 315 may form a mold having a staircase shape. For example, the insulation patterns 315 and the gate electrodes 480 may be alternately and repeatedly stacked in the first direction D1. That is, a gate electrode structure including the gate electrodes 480 stacked in the first direction D1 and the insulation patterns 315 between the gate electrodes 480 may form the mold. The insulation pattern 315 may include an oxide, e.g., silicon oxide ($SiO_2$).

In an example embodiment of the present inventive concept, the gate electrode 480 may protrude more than the insulation pattern 315 toward the channel 365 in a horizontal direction substantially parallel to the upper surface of the substrate 100.

In an example embodiment of the present inventive concept, the mold, that is, the gate electrode structure may extend in the second direction D2, and a plurality of gate electrode structures may be disposed in the third direction D3. The division pattern 490 may be formed between the molds, and thus the mold may be spaced apart from each other in the third direction D3. The division pattern 490 may include an oxide, e.g., silicon oxide ($SiO_2$).

A width in the horizontal direction of the memory channel structure may vary periodically in the first direction D1, and the memory channel structure may include a filling pattern 385 extending in the first direction D1, a resistance pattern 375 on a sidewall of the filling pattern 385 and extending in the first direction D1, a channel 365 on an outer sidewall of the resistance pattern 375 and extending in the first direction D1, and a capping pattern 395 on the filling pattern 385, the resistance pattern 375 and the channel 365. For example, the resistance pattern 375 may be interposed between the channel 365 and the filling pattern 385. For example, the channel 365 may surround the resistance pattern 375.

A width of a first portion of the resistance pattern 375 facing the gate electrode 480 in the horizontal direction may be substantially equal to a width of a second portion of the resistance pattern 375 facing the insulation pattern 315 in the horizontal direction.

The resistance pattern 375 may include a first vertical extension portion 375a on an inner sidewall of the channel 365 and extending in the first direction D1, a first protrusion portion 375b on an inner sidewall of the first vertical extension portion 375a and protruding in the horizontal direction, and a second protrusion portion 375c on an outer sidewall of the first vertical extension portion 375a and protruding in the horizontal direction, which may not overlap the first protrusion portion 375b in the horizontal direction. The width of the first portion of the resistance pattern 375 in the horizontal direction may be a sum of a width of the first protrusion portion 375b in the horizontal direction and a width of the first vertical extension portion 375a in the horizontal direction. The width of the second portion of the resistance pattern 375 in the horizontal direction may be a sum of a width of the second protrusion portion 375c in the horizontal direction and the width of the first vertical extension portion 375a in the horizontal direction. Based on FIG. 4, the horizontal direction may be the third direction D3.

In an example embodiment of the present inventive concept, a plurality of first protrusion portions 375b may be spaced apart from each other in the first direction D1, and each of the first protrusion portions 375b may overlap a corresponding one of the gate electrodes 480 in the horizontal direction. A plurality of second protrusion portions 375c may be spaced apart from each other in the first direction D1, and each of the second protrusion portions 375c may overlap a corresponding one of the insulation patterns 315.

The resistance pattern 375 may include a phase-changeable material that may have a resistance changing by phase-change. In an example embodiment of the present inventive concept, the resistance pattern 375 may include a chalcogenide-based material in which germanium (Ge), antimony (Sb) and/or tellurium (Te) are combined in a predetermined ratio. In an example embodiment of the present inventive concept, the resistance pattern 375 may include a super lattice in which germanium-tellurium (GeTe) and antimony-tellurium (SbTe) are repeatedly stacked. In an example embodiment of the present inventive concept, the resistance pattern 375 may include IST containing indium-antimony-tellurium, or BST containing bismuth-antimony-tellurium. The resistance pattern 375 may further include, e.g., carbon (C), nitride (N), boron (B), oxygen (O), etc. In addition, according to an example embodiment of the present inventive concept, the resistance pattern 375 may include at least one or a combination of, for example, indium selenide (InSe), gallium antimonide (GaSb), indium antimonide (InSb), arsenic telluride (AsTe), aluminium telluride (AlTe), germanium antimony telluride (GeSbTe), tellurium germanium arsenide (TeGeAs), tellurium tin selenide (TeSnSe), germanium selenium gallide (GeSeGa), bismuth selenium antimonide (BiSeSb), gallium selenium telluride (GaSeTe), tin antimony telluride (SnSbTe), indium antimony germanide (InSbGe), indium germanium telluride (InGeTe), germanium tin telluride (GeSnTe), germanium bismuth telluride (GeBiTe), germanium tellurium selenide (GeTeSe), arsenic antimony telluride (AsSbTe), bismuth selenium antimonide (BiSnSb), germanium tellurium oxide (GeTeO), tellurium germanium antimony sulfide (TeGeSbS), tellurium germanium tin oxide (TeGeSnO), tellurium germanium tin gold (TeGeSnAu), palladium tellurium germanium tin (PdTeGeSn), indium selenium titanium cobalt (InSeTiCo), germanium antimony tellurium palladium (GeSbTePd), germanium antimony tellurium cobalt (GeSbTeCo), antimony tellurium bismuth selenium (SbTeBiSe), silver indium antimony tellurium (AgInSbTe), germanium antimony selenium tellurium (GeSbSeTe), germanium tin antimony tellurium (GeSnSbTe), germanium tellurium tin nickel (GeTeSnNi), germanium tellurium tin palladium (GeTeSnPd), germanium tellurium tin platinum (GeTeSnPt), indium tin antimony tellurium (InSnSbTe), or arsenic germanium antimony tellurium (AsGeSbTe).

The channel 365 may include a third portion facing the gate electrode 480 in the horizontal direction and a fourth portion facing the insulation pattern 315. A width of the third portion of the channel 365 may be substantially equal to a width of the fourth portion of the channel 365.

In an example embodiment of the present inventive concept, the third and fourth portions of the channel 365 may overlap the first and second portions, respectively, of the resistance pattern 375 in the horizontal direction.

The channel 365 may include a second vertical extension portion 365a extending in the first direction D1, a third protrusion portion 365b on an inner sidewall of the second vertical extension portion 365a and protruding in the horizontal direction, and a fourth protrusion portion 365c on an outer sidewall of the second vertical extension portion 365a and protruding in the horizontal direction, which may not overlap the third protrusion portion 365b in the horizontal direction. The width of the third portion of the channel 365 in the horizontal direction may be a sum of a width of the third protrusion portion 365b in the horizontal direction and a width of the second vertical extension portion 365a in the horizontal direction. The width of the fourth portion of the channel 365 in the horizontal direction may be a sum of a width of the fourth protrusion portion 365c in the horizontal direction and the width of the second vertical extension portion 365a in the horizontal direction.

In an example embodiment of the present inventive concept, a plurality of third protrusion portions 365b may be spaced apart from each other in the first direction D1, and the third protrusion portions 365b may overlap the gate electrodes 480 and the first protrusion portion 375b of the resistance pattern 375. The third protrusion portion 365b may be interposed between and overlapped with two adjacent second protrusion portions 375C of the resistance pattern 375 in the first direction D1. A plurality of fourth protrusion portions 365c may be spaced apart from each other in the first direction D1, and the fourth protrusion portions 365c may overlap the insulation patterns 315 and the second protrusion portion 375c of the resistance pattern 375 in the horizontal direction.

The channel 365 may include undoped polysilicon (p-Si) or lightly doped polysilicon (p-Si).

The filling pattern 385 may include a third vertical extension portion 385a extending in the first direction D1 and fifth protrusion portions 385b spaced apart from each other on a sidewall of the third vertical extension portion 385a in the vertical direction and protruding in the horizontal direction.

In an example embodiment of the present inventive concept, the fifth protrusion portion 385b may overlap the second portion of the resistance pattern 375 and the fourth portion of the channel 365 in the horizontal direction, and may also overlap the second protrusion portion 375c of the resistance pattern 375 and the fourth protrusion portion 365c of the channel 365 in the horizontal direction. The first protrusion portion 375b of the resistance pattern 375 may overlap the fifth protrusion portion 385b of the filling pattern 385 in the vertical direction. For example, the fifth protrusion portion 385b may be interposed between and overlapped with two adjacent first protrusion portions 375b of the resistance pattern 375 in the first direction D1.

The filling pattern 385 may include an oxide, e.g., silicon oxide ($SiO_2$).

The capping pattern 395 may be formed on upper surfaces of the filling pattern 385 and the resistance pattern 375 and an inner sidewall of the channel 365, and may include, e.g., undoped or doped polysilicon (p-Si).

The channel connection pattern 440 and the support layer 300 may be sequentially stacked on the CSP 240 in the first direction D1. The channel connection pattern 440 may contact a lower outer sidewall of the channel 365, and thus some of the channels 365 may be connected with each other. The channel connection pattern 440 may include, e.g., polysilicon (p-Si) doped with n-type impurities, and an air gap 450 may be formed in the channel connection pattern 440.

The support layer 300 may be formed between the channel connection pattern 440 and a lowermost one of the gate electrodes 480, and the support pattern 305 may extend through the channel connection pattern 440 to contact an upper surface of the substrate 100. The channels 365 between neighboring ones of the division pattern 490 in the third direction D3 may be connected with each other by the channel connection pattern 440 to form a channel block. A plurality of support patterns 305 may be formed with various layouts. The support layer 300 and the support pattern 305 may include, e.g., polysilicon (p-Si) doped with n-type impurities.

The third insulating interlayer 330 may cover the mold on the CSP 240, the fourth insulating interlayer 400 may be formed on the third insulating interlayer 330, the memory channel structure, the division pattern 490 and the blocking pattern 470, and the fifth insulating interlayer 500 may be formed on the fourth insulating interlayer 400, the division pattern 490 and the blocking pattern 470. The third to fifth insulating interlayers 330, 400 and 500 may include an oxide, e.g., silicon oxide ($SiO_2$).

The contact plug 510 may extend through the fourth and fifth insulating interlayers 400 and 500 to contact an upper surface of the capping pattern 395, and the bit line 520 may extend in the third direction D3 to contact the contact plug 510. In an example embodiment of the present inventive concept, a plurality of bit lines 520 may be disposed in the second direction D2.

Each gate electrode 480 and the channel 365, the resistance pattern 375 and the filling pattern 385 overlapping in the horizontal direction may form a memory cell, and a plurality of memory cells may be disposed in the first direction D1.

A writing operation of the semiconductor device may be performed by changing a resistance of a selected memory cell among the memory cells. That is, a turn off voltage (Voff) less than a threshold voltage may be applied to the selected memory cell, and a pass voltage (Vpass) may be applied to non-selected memory cells among the memory cells. A current may flow through the channel 365 of the selected memory cell, and Joule's heat by the current may be provided to the resistance pattern 375 of the selected memory cell. The phase of the resistance pattern 375 of the selected memory cell may be changed from an amorphous state having a relatively high resistance into a crystalline state having a relatively low resistance, and thus the current may flow through the selected memory cell and data may be stored in the selected memory cell.

The Joule's heat provided to the resistance pattern 375 of the selected memory cell may be transferred to neighboring non-selected memory cell in the first direction D1. Thus, the phase of the resistance pattern 375 of the non-selected memory cell may also be changed from an amorphous state having a relatively high resistance into a crystalline state having a relatively low resistance, and thus the current may also flow through the non-selected memory cell and data may be stored in the non-selected memory cell. In this case, the writing operation of the semiconductor device deteriorates.

In an example embodiment of the present inventive concept, the resistance pattern 375 may include the first vertical extension portion 375a extending in the first direction D1, the first protrusion portion 375b on the inner sidewall of the first vertical extension portion 375a and protruding in the horizontal direction, and the second protrusion portion 375c on the outer sidewall of the first vertical extension portion 375a and protruding in the horizontal direction and not overlapping the first protrusion portion 375b in the horizontal direction. Accordingly, the Joule's heat provided to the resistance pattern 375 of the selected memory cell may be transferred to a route including the first vertical extension portion 375a and the first protrusion portion 375b of the resistance pattern 375 of the selected memory cell, and the first vertical extension portion 375a and the second protrusion portion 375c of the resistance pattern 375 overlapping in the horizontal direction the insulation pattern 315 adjacent to the selected memory cell in the first direction D1.

The resistance pattern 375 may include the first and second protrusion portions 375b and 375c so that the route of heat transfer may be enlarged, and thus an amount of heat transferred from the selected memory cell to the neighboring non-selected memory cell may decrease. Accordingly, even Joule's heat is provided to the resistance pattern 375 of the selected memory cell, the resistance pattern 375 of the non-selected memory cell may be still in an amorphous state, so that no current may flow through the resistance pattern 375 of the non-selected memory cell. As a result, data may be stored only in the selected memory cell, and the wiring operation of the semiconductor device may be enhanced.

FIGS. 6 to 16 are cross-sectional views illustrating a method of manufacturing a semiconductor device in accordance with an example embodiment of the present inventive concept.

Figure 6:
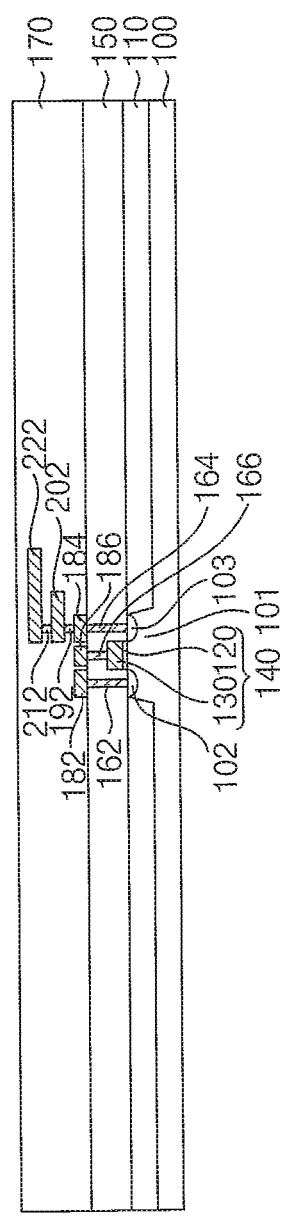
FIGS. 6 to 16 are cross-sectional views illustrating a method of manufacturing a semiconductor device in accordance with an example embodiment of the present inventive concept.

Referring to FIG. 6, a lower circuit pattern may be formed on a substrate 100, and first and second insulating interlayers 150 and 170 may be sequentially formed on the substrate 100.

The lower circuit pattern may include, e.g., transistors, lower contact plugs, lower wirings, lower vias, etc., and each element included in the lower circuit pattern may be formed by, e.g., a damascene process or a patterning process.

Figure 7:
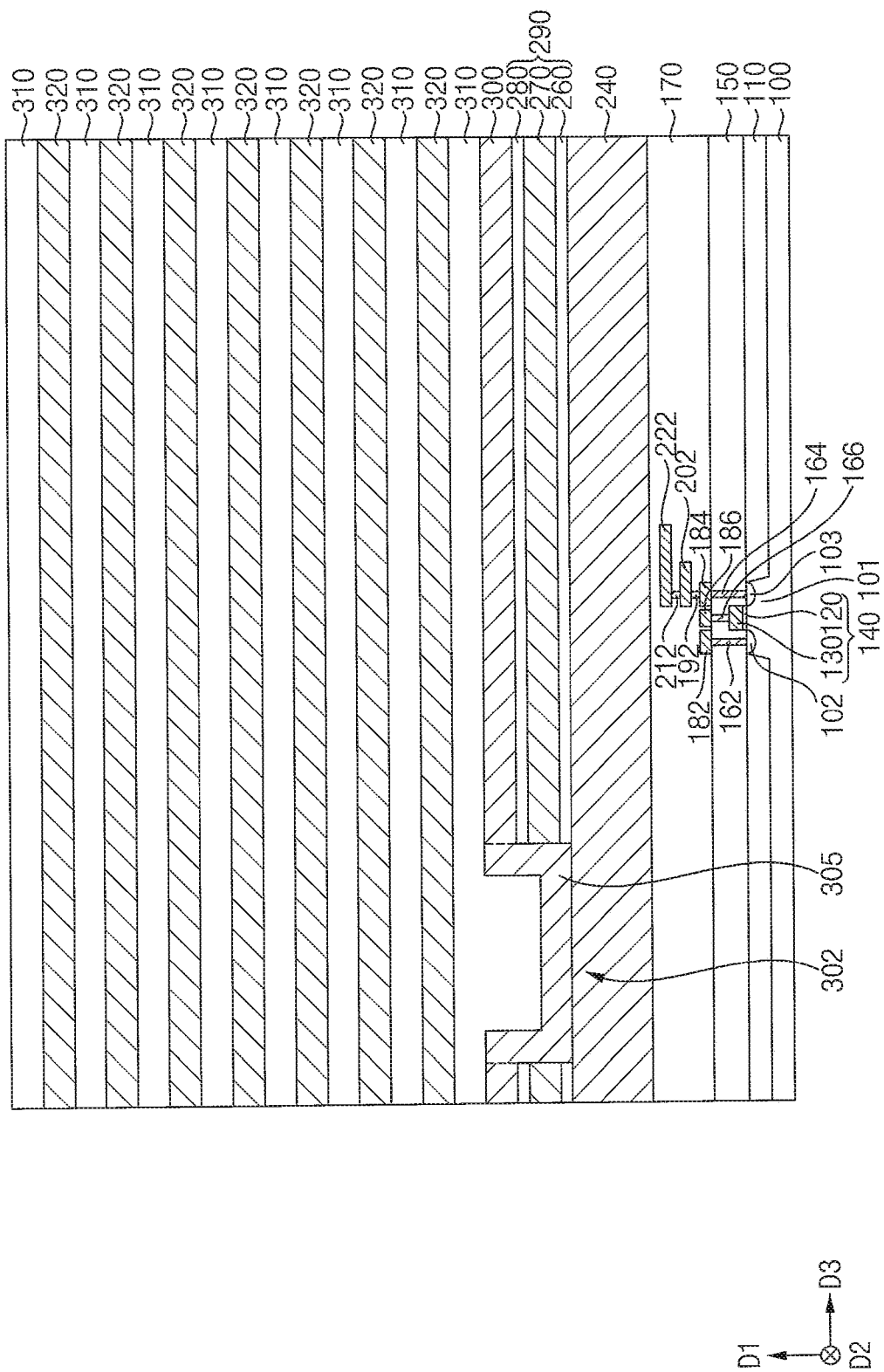

Referring to FIG. 7, a common source plate (CSP) 240 and a sacrificial layer structure 290 may be sequentially formed on the second insulating interlayer 170, the sacrificial layer structure 290 may be partially removed to form a first opening 302 exposing an upper surface of the CSP 240, and a support layer 300 may be formed on an upper surface of the sacrificial layer structure 290 and the exposed upper surface of the CSP 240.

The sacrificial layer structure 290 may include first, second and third sacrificial layers 260, 270 and 280 sequentially stacked.

The support layer 300 may include a material having an etching selectivity with respect to the first to third sacrificial layers 260, 270 and 280, e.g., polysilicon (p-Si) doped with n-type impurities. In an example embodiment of the present inventive concept, the support layer 300 may be formed by forming a doped or undoped amorphous silicon (a-Si) layer and performing a heat treatment process on the amorphous silicon (a-Si) layer to crystalize amorphous silicon (a-Si).

The support layer 300 may have a uniform thickness, and thus a first recess may be formed on a portion of the support layer 300 in the first opening 302. Hereinafter, the portion of the support layer 300 in the first opening 302 may be referred to as a support pattern 305.

An insulation layer 310 and a fourth sacrificial layer 320 may be alternately and repeatedly stacked on the support layer 300 and the support pattern 305, and thus a mold layer including the insulation layers 310 and the fourth sacrificial layers 320 alternately stacked may be formed. The insulation layer 310 may include an oxide, e.g., silicon oxide ($SiO_2$), and the fourth sacrificial layer 320 may include a material having an etching selectivity with respect to the insulation layer 310, e.g., a nitride such as silicon nitride ($Si_3N_4$).

An etching process may be performed on the mold layer using a photoresist pattern as an etching mask, and a trimming process in which an area of the photoresist pattern is reduced by a given ratio may be performed. The etching process and the trimming process may be alternately and repeatedly performed to form a mold including a plurality of step layers each having the fourth sacrificial layer 320 and the insulation layer 310. Hereinafter, the "step layer" may be defined as not only an exposed portion but also a non-exposed portion of the fourth sacrificial layer 320 and the insulation layer 310 at the same level, and the exposed portion thereof may be defined as a "step." For example, the step layers included in the fourth sacrificial layer 320 and the insulation layer 310 may have lengths extending in the second direction D2, and the lengths may gradually decrease from a lowermost one toward an uppermost one thereof.

Figure 8:
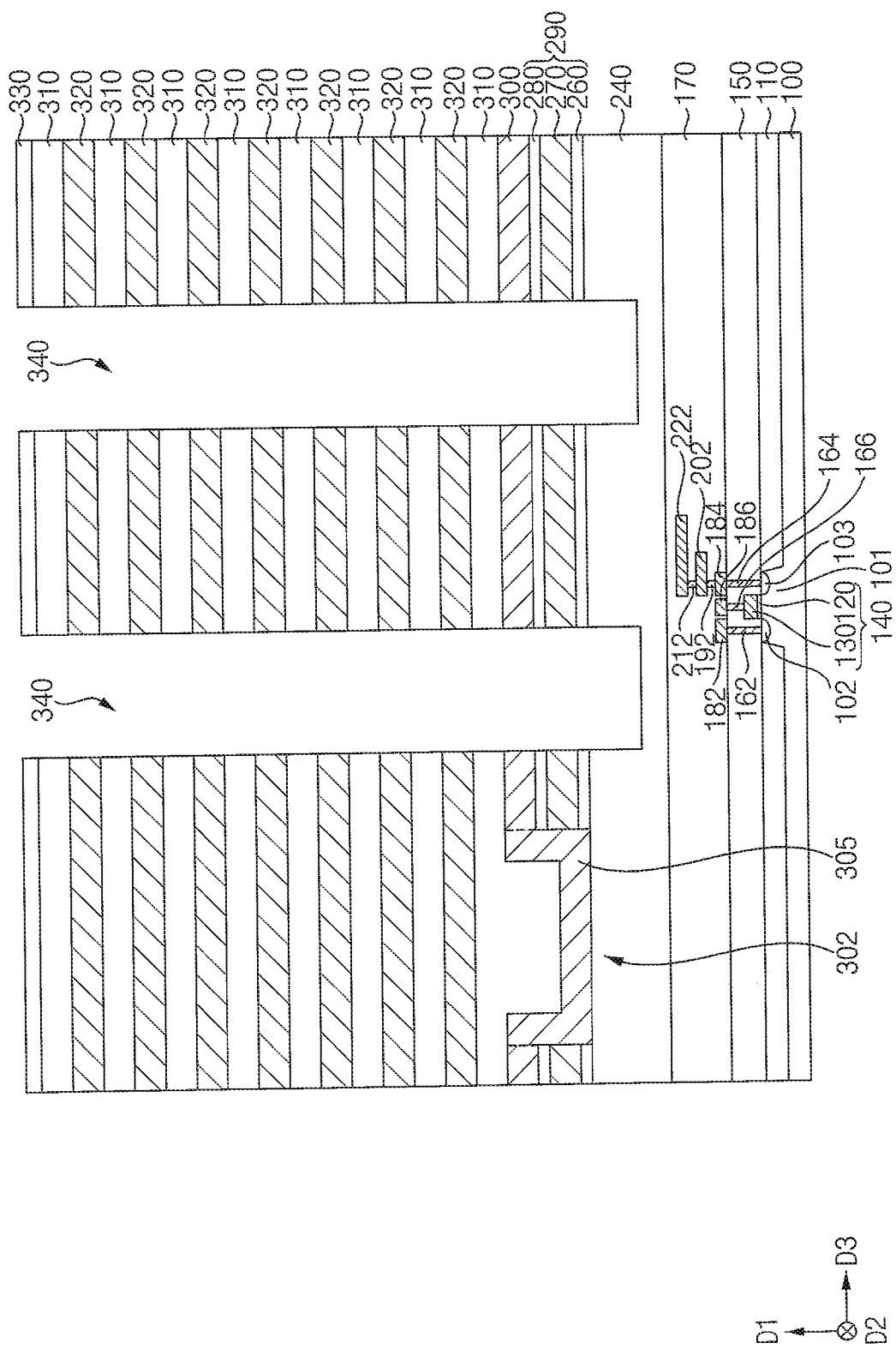

Referring to FIG. 8, a third insulating interlayer 330 may be formed on the substrate 100 to cover the mold, and a dry etching process may be performed to form a channel hole 340 extending in the first direction D1 through the third insulating interlayer 330 and the mold and exposing an upper surface of the CSP 240.

In an example embodiment of the present inventive concept, the dry etching process may be performed until the channel hole 340 may expose the upper surface of the CSP 240, and further the channel hole 340 may extend through an upper portion of the CSP 240. In an example embodiment of the present inventive concept, a plurality of channel holes 340 may be spaced apart from each other in the second and third directions D2 and D3.

Figure 9:
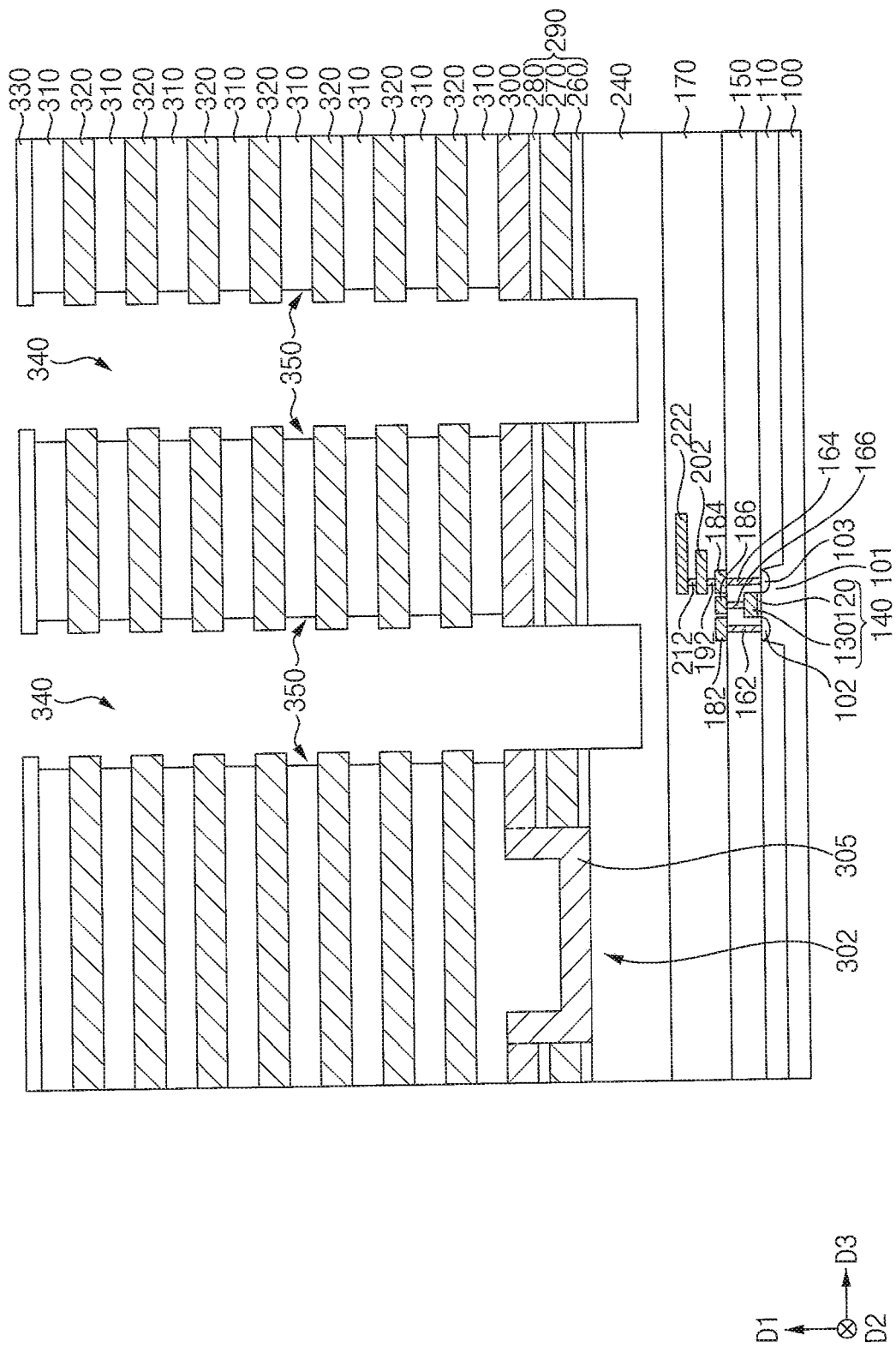

Referring to FIG. 9, a portion of the insulation layer 310 exposed by the channel hole 340 may be removed in the horizontal direction by an etching process to form a second recess 350. Thus, the fourth sacrificial layer 320 may protrude more than the insulation layer 310 in the horizontal direction toward the channel hole 340.

In an example embodiment of the present inventive concept, the etching process may include a wet etching process and/or a dry etching process, and the dry etching process may be an isotropic etching process.

Figure 10:
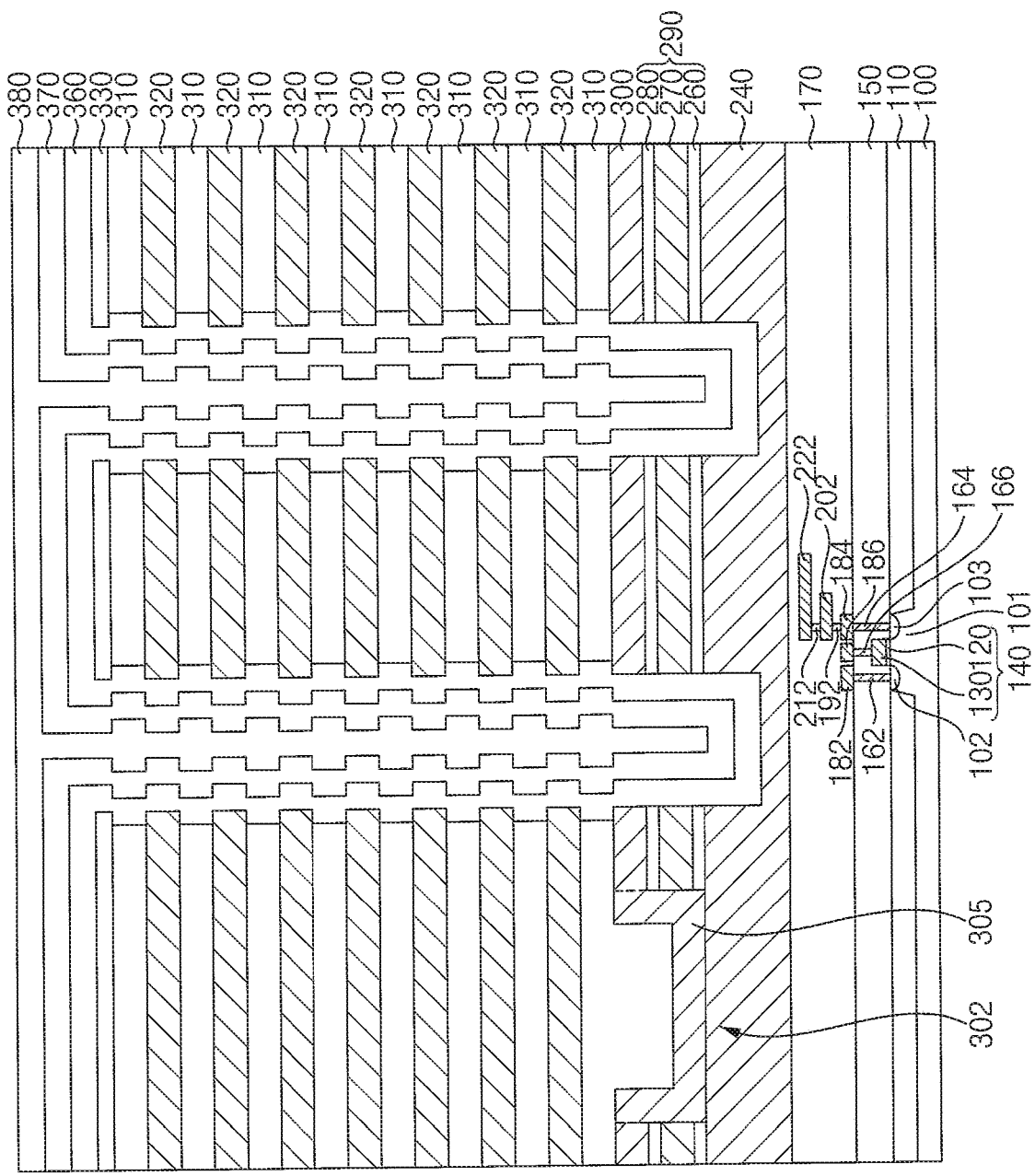

Referring to FIG. 10, a channel layer 360 may be formed on a sidewall of the channel hole 340, the exposed upper surface of the CSP 240 and an upper surface of the third insulating interlayer 330 to fill the second recess 350, and a resistance layer 370 may be formed on the channel layer 360. Sidewalls of the channel layer 360 and the resistance layer 370 in the channel hole 340 may have a shape substantially the same as a shape of sidewalls of the second recesses 350 and the fourth sacrificial layers 320.

A filling layer 380 may be formed on the resistance layer 370 to fill a remaining portion of the channel hole 340.

Figure 11:
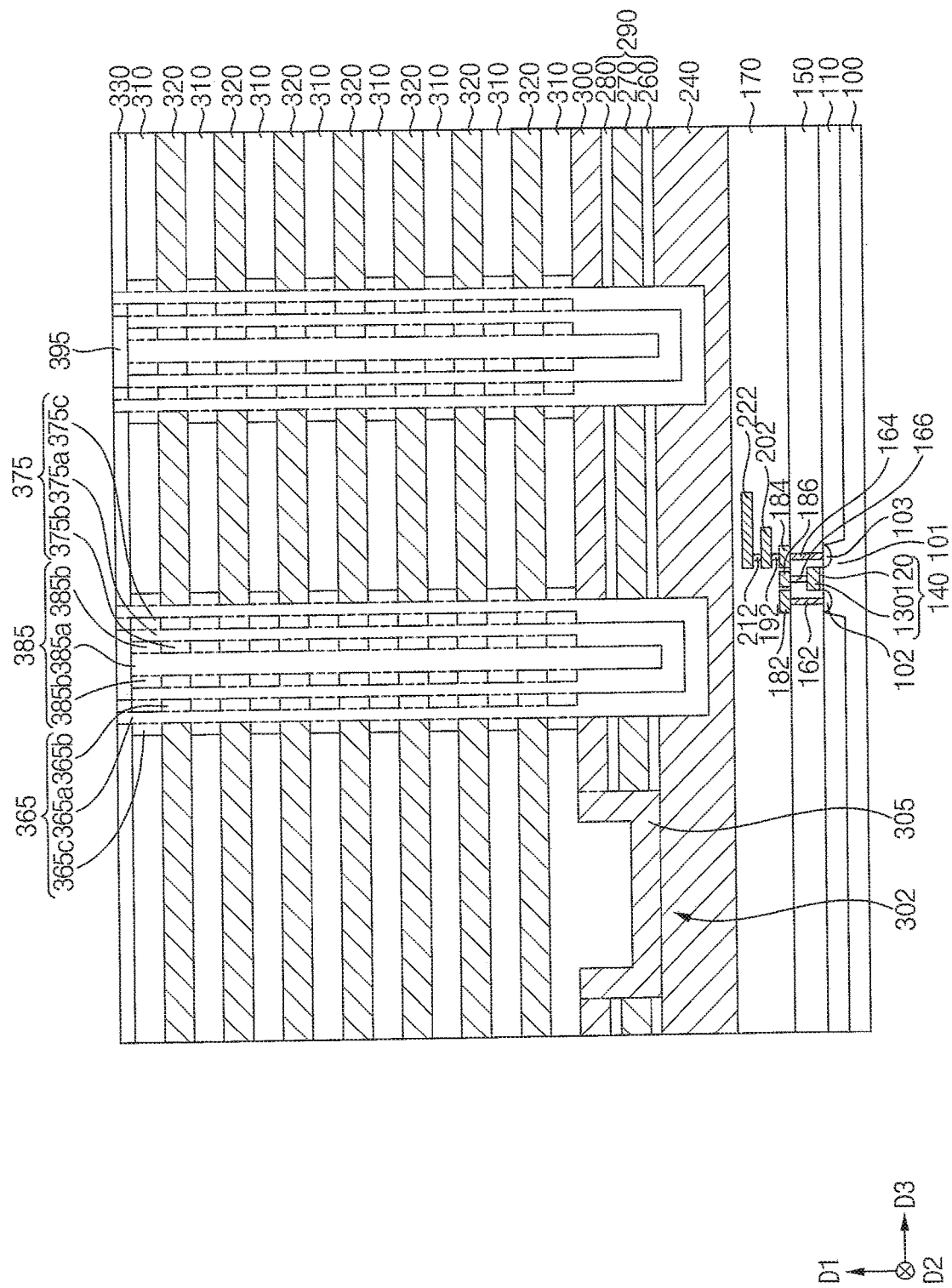

Referring to FIG. 11, the filling layer 380, the resistance layer 370 and the channel layer 360 may be planarized until the upper surface of the third insulating interlayer 330 is exposed to form a filling pattern 385, a resistance pattern 375 and a channel 365 in the channel hole 340. An etch-back or chemical mechanical polishing (CMP) process may be employed to planarize the filling layer 380, the resistance layer 370 and the channel layer 360. The filling pattern 385, the resistance pattern 375 and the channel 365 formed in the channel hole 340 may constitute the memory channel structure, and the width of the memory channel structure in the horizontal direction substantially parallel to the upper surface of the substrate 100 may vary periodically in the vertical direction in accordance with a distance between opposite sidewalls of the second recesses 350 and a distance between opposite sidewalls of the fourth sacrificial layers 320 in the channel hole 340.

The resistance pattern 375 may include a first vertical extension portion 375a on an inner sidewall of the channel 365 and extending in the first direction D1, a first protrusion portion 375b on an inner sidewall of the first vertical extension portion 375a and protruding in the horizontal direction, and a second protrusion portion 375c on an outer sidewall of the first vertical extension portion 375a and protruding in the horizontal direction and not overlapping the first protrusion portion 375b in the horizontal direction. The resistance pattern 375 and the channel 365 may be in direct contact with each other at the outer sidewall of the resistance pattern 375 and at the inner sidewall of the channel 365.

The channel 365 may include a second vertical extension portion 365a extending in the first direction D1, a third protrusion portion 365b on an inner sidewall of the second vertical extension portion 365a and protruding in the horizontal direction, and a fourth protrusion portion 365c on an outer sidewall of the second vertical extension portion 365a and protruding in the horizontal direction, which may not overlap the third protrusion portion 365b in the horizontal direction. The third protrusion portion 365b may be interposed between and overlapped with two adjacent second protrusion portions 375C of the resistance pattern 375 in the first direction D1.

The channels 365 may be formed in the horizontal direction to form a channel array.

The filling pattern 385 may include a third vertical extension portion 385a extending in the first direction D1 and fifth protrusion portions 385b spaced apart from each other on a sidewall of the third vertical extension portion 385a in the vertical direction and protruding in the horizontal direction. The fifth protrusion portion 385b may be interposed between and overlapped with two adjacent first protrusion portions 375b of the resistance pattern 375 in the first direction D1.

Upper portions of the filling pattern 385 and the resistance pattern 375 may be removed to form a third recess, a capping layer may be formed on the filling pattern 385, the resistance pattern 375, the channel 365 and the third insulating interlayer 330 to fill the third recess, and the capping layer may be planarized until an upper surface of the third insulating interlayer 330 is exposed to form a capping pattern 395 contacting an inner upper sidewall of the channel 365. An etch-back or chemical mechanical polishing (CMP) process may be employed to planarize the capping layer.

The channel 365, the resistance pattern 375, the filling pattern 385 and the capping pattern 395 may form a memory channel structure.

Figure 12:
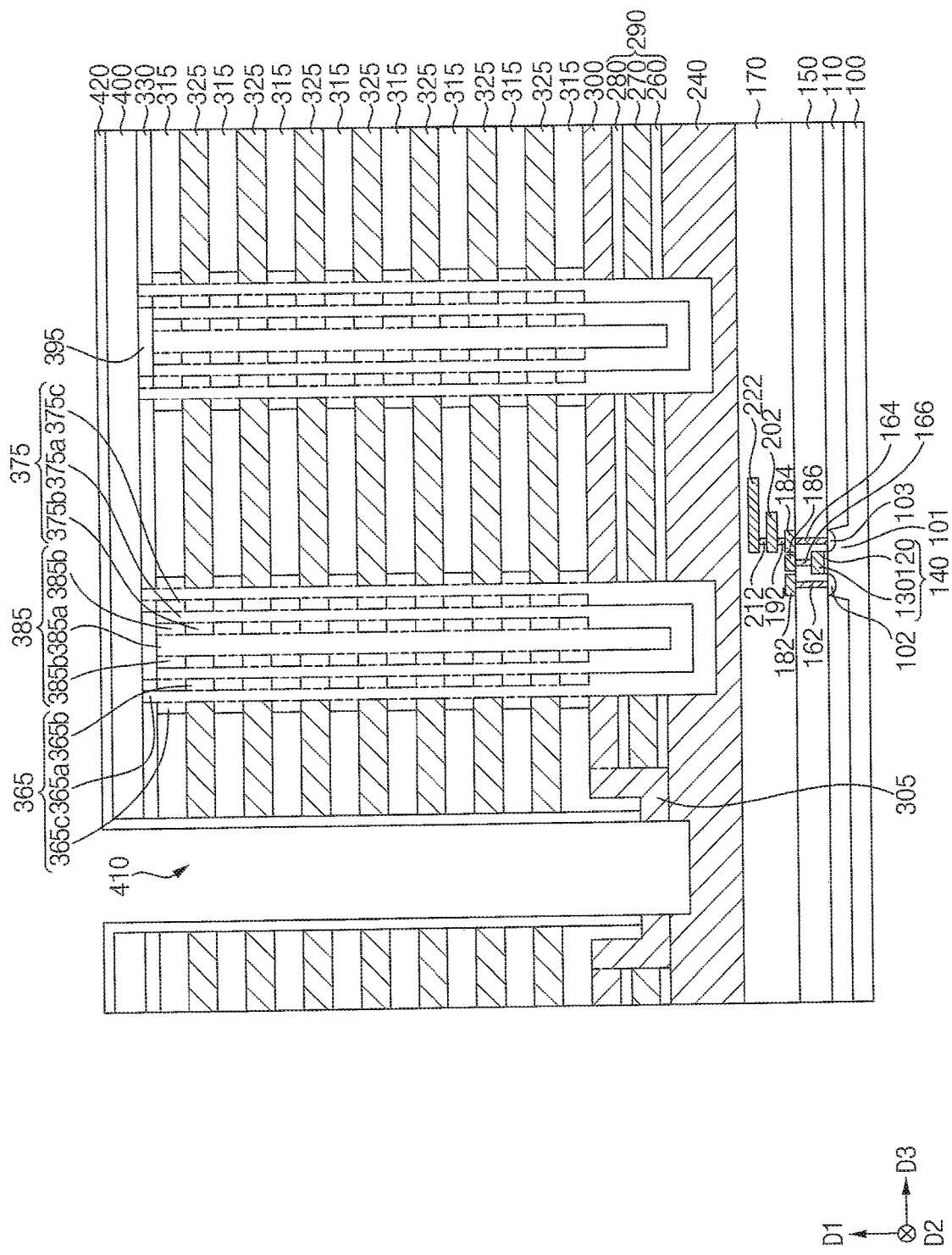

Referring to FIG. 12, a fourth insulating interlayer 400 may be formed on the third insulating interlayer 330, the channel 365 and the capping pattern 395, and a second opening 410 may be formed partially through the third and fourth insulating interlayers 330 and 400 and the mold by a dry etching process.

In an example embodiment of the present inventive concept, the dry etching process may be performed until the second opening 410 exposes an upper surface of the support layer 300 or the support pattern 305, and further, the second opening 410 may extend through an upper portion of the support layer 300 or the support pattern 305. As the second opening 410 is formed, the insulation layer 310 and the fourth sacrificial layer 320 included in the mold may be exposed.

In an example embodiment of the present inventive concept, the second opening 410 may extend in the second direction D2, and a plurality of second openings 410 may be formed in the third direction D3. As the second opening 410 is formed, the insulation layer 310 may be divided into insulation patterns 315 each of which may extend in the second direction D2, and the fourth sacrificial layer 320 may be divided into fourth sacrificial patterns 325 each of which may extend in the second direction D2.

A spacer layer may be conformally formed on a sidewall of the second opening 410, the upper surfaces of the support layer 300 and the support pattern 305 exposed by the second opening 410, and the fourth insulating interlayer 400, and may be anisotropically etched so that portions of the spacer layer on the support layer 300 and the support pattern 305 may be removed to form a spacer 420, and the upper surfaces of the support layer 300 and the support pattern 305 may be partially exposed. For example, the portion of the spacer layer on the support pattern 305 exposed by the second opening 410 may be removed by the anisotropic etching process.

The exposed portions of the support layer 300 and the support pattern 305 and a portion of the sacrificial layer structure 290 thereunder may be removed to enlarge the second opening 410. Thus, the second opening 410 may expose an upper surface of the CSP 240, and further, may extend through an upper portion of the CSP 240.

When the sacrificial layer structure 290 is partially removed, a sidewall of the second opening 410 may be covered by the spacer 420, and the spacer 420 may include a material different from the sacrificial layer structure 290, and thus the insulation pattern 315 and the fourth sacrificial pattern 325 included in the mold might not be removed. For example, the spacer 420 may be formed of a material having a low etch rate toward the etchant used in etching away the sacrificial layer structure 290.

Figure 13:
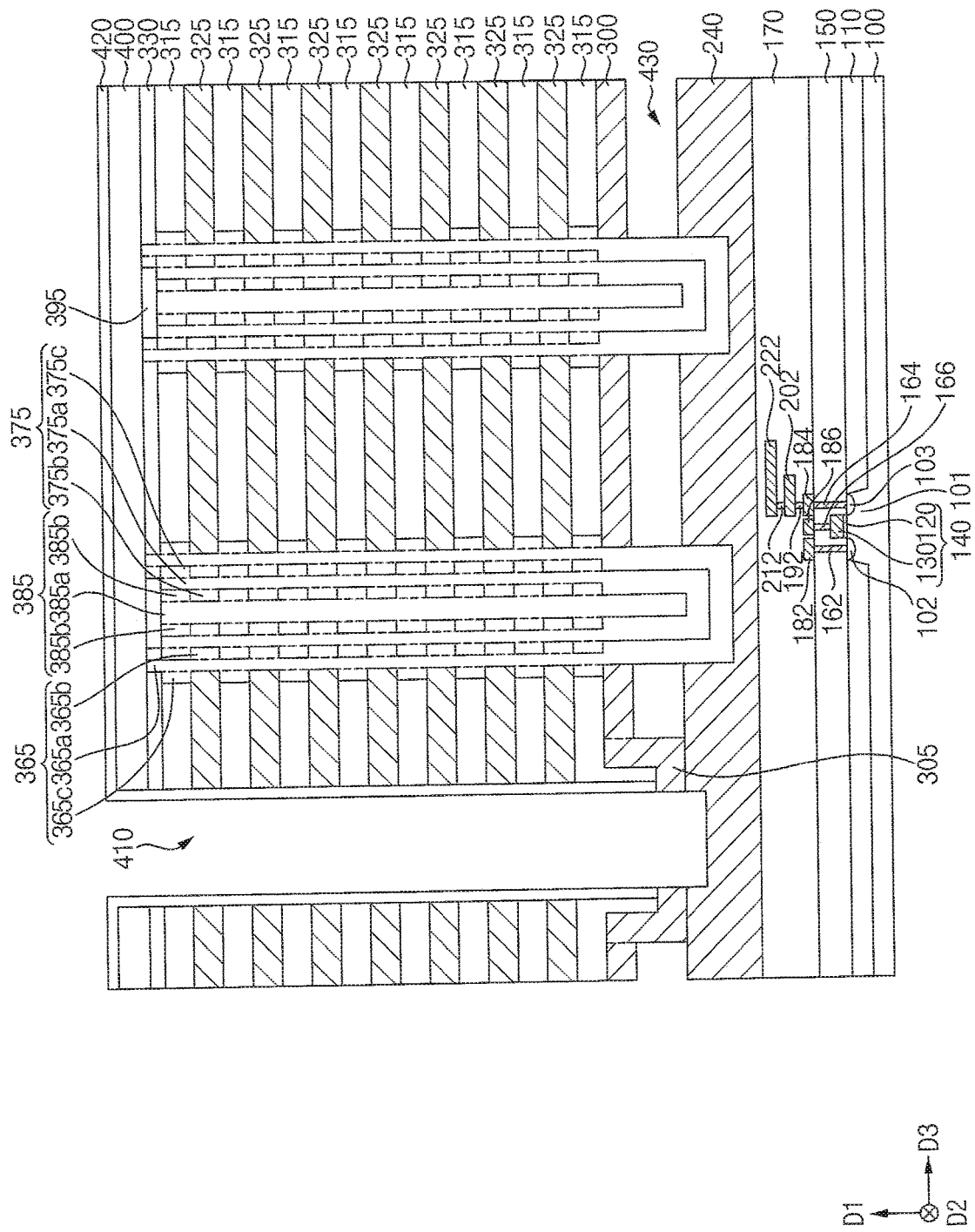

Referring to FIG. 13, the sacrificial layer structure 290 exposed by the second opening 410 may be removed to form a first gap 430 exposing a lower outer sidewall of the channel 365.

The sacrificial layer structure 290 may be removed by a wet etching process, using e.g., hydrofluoric acid (HF) and/or phosphoric acid ($H_3PO_4$). When the first gap 430 is formed, the support layer 300, the support pattern 305, the channel 365, the resistance pattern 375 and the filling pattern 385 might not be removed and support the mold.

Figure 14:
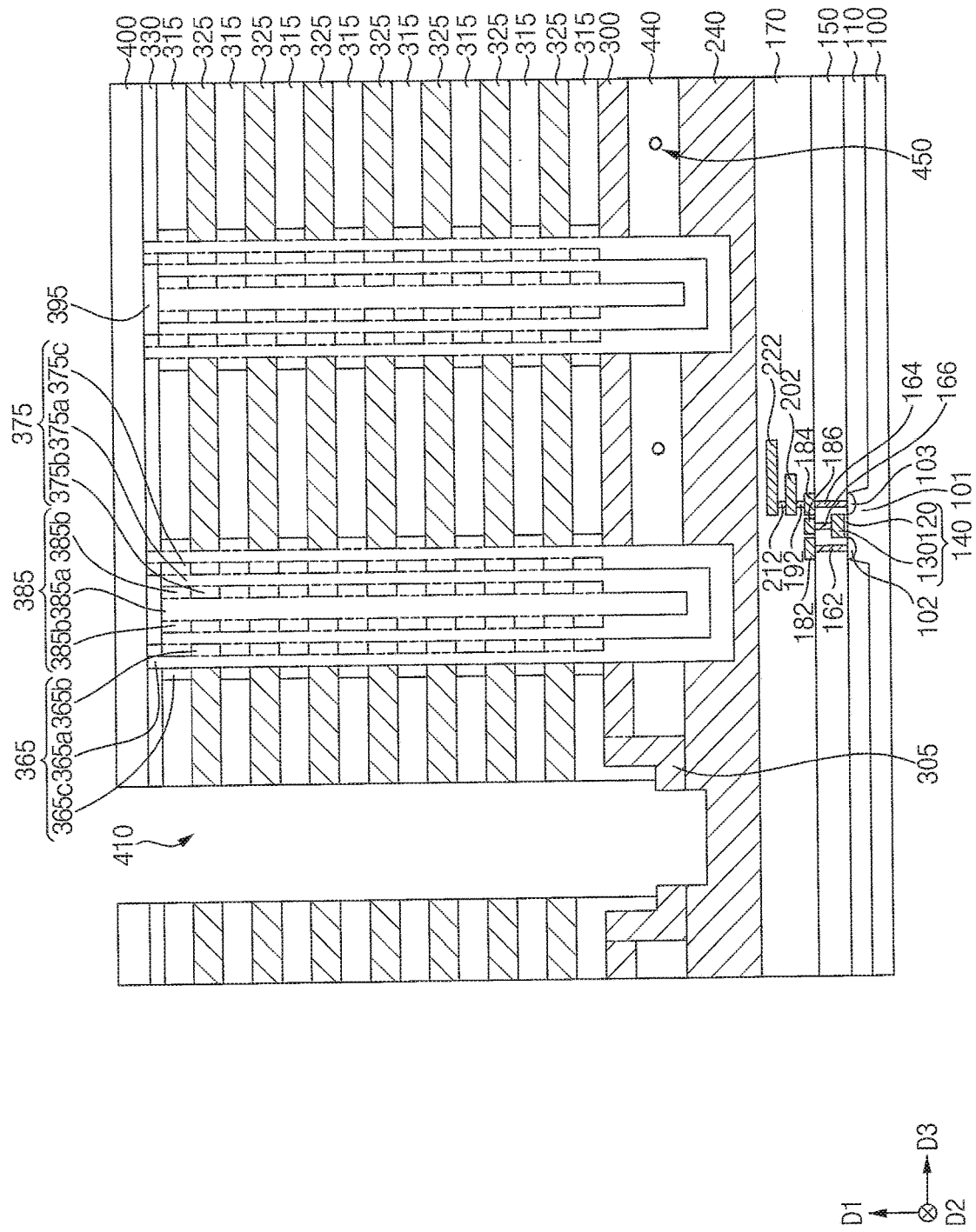

Referring to FIG. 14, after removing the spacer 420, a channel connection pattern 440 may be formed to fill the first gap 430.

The channel connection pattern 440 may be formed by forming a channel connection layer on the sidewall of the second opening 410, the exposed upper surface of the CSP 240, and the fourth insulating interlayer 400 to fill the first gap 430, and performing an etch back process on the channel connection layer. The channel connection layer may include, e.g., amorphous silicon (a-Si) doped with n-type impurities, and may be crystallized by heat generated from deposition processes of forming other layers so as to include polysilicon (p-Si) doped with n-type impurities. As the channel connection pattern 440 is formed, the channels 365 between neighboring ones of the second openings 410 in the third direction D3 may be connected with each other to form a channel block.

An air gap 450 may be formed in the channel connection pattern 440.

Figure 15:
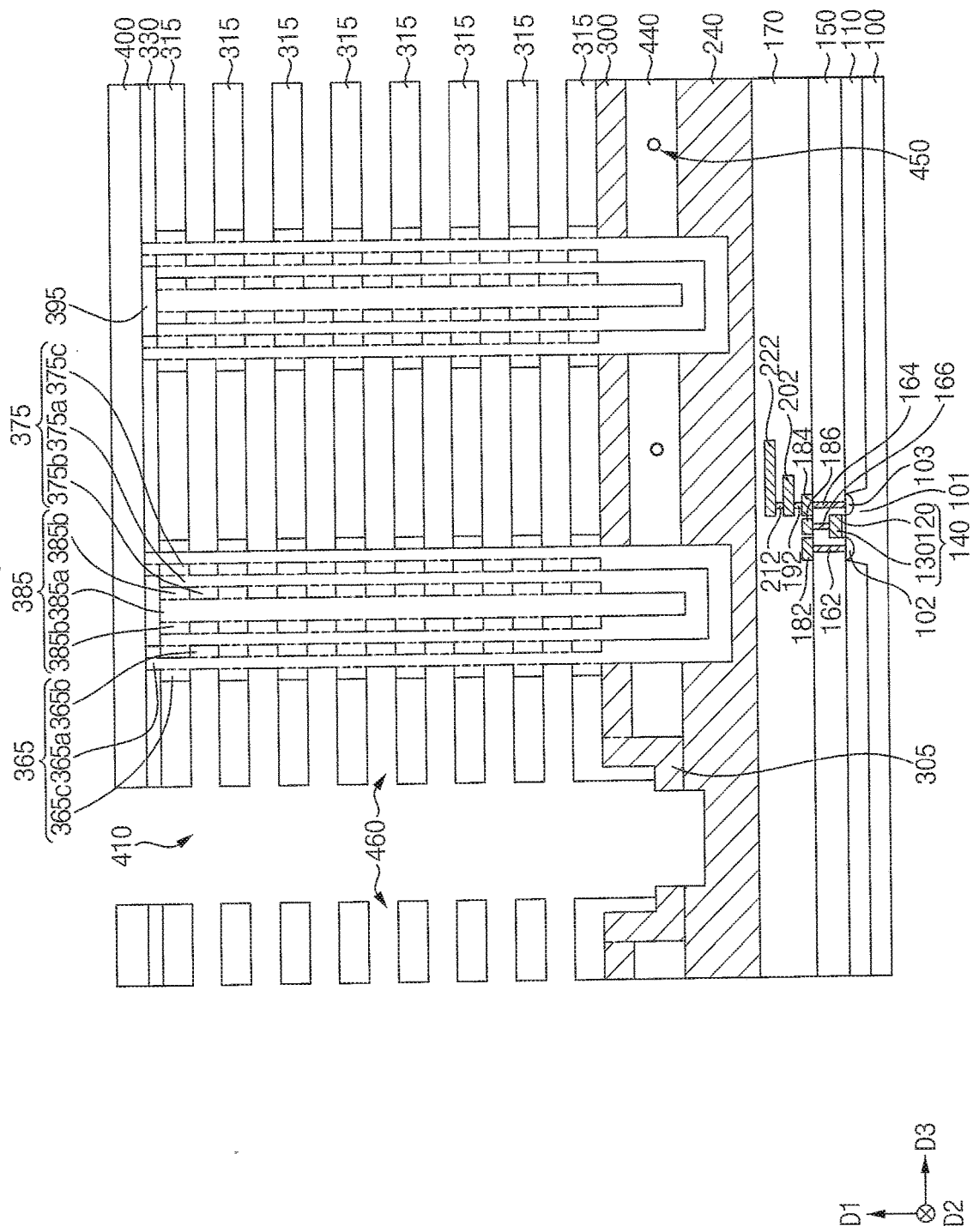

Referring to FIG. 15, the fourth sacrificial patterns 325 may be selectively removed to form a second gap 460 exposing an outer sidewall of the channel 365. The insulation patterns 315, the support layer 300, the support pattern 305, the channel 365, the resistance pattern 375 and the filling pattern 385, the channel connection pattern 440 might not be removed. The fourth sacrificial patterns 325 may be removed by a wet etching process, using e.g., phosphoric acid ($H_3PO_4$) or sulfuric acid ($H_2SO_4$).

Figure 16:
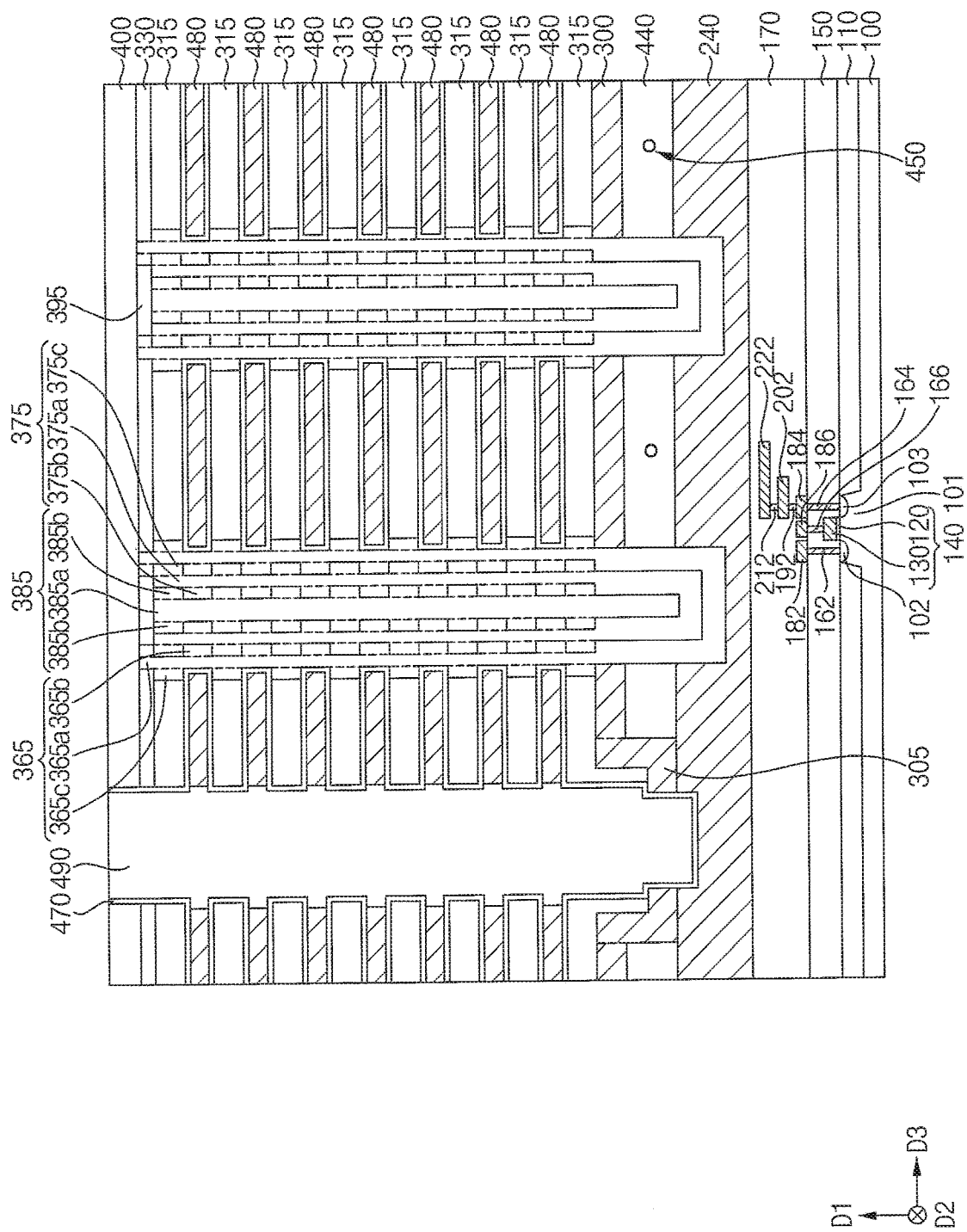

Referring to FIG. 16, a blocking layer may be conformally formed on the outer sidewalls of the channel 365 exposed by the second gaps 460, inner walls of the second gaps 460, surfaces of the insulation patterns 315, sidewalls of the support layer 300 and the support pattern 305, a sidewall of the channel connection pattern 440, the upper surface of the CSP 240, and an upper surface of the fourth insulating interlayer 400, and a gate electrode layer may be formed on the blocking layer to fill the second gaps 460 and the second opening 410 by using a chemical vapor deposition (CVD) process or an atomic layer deposition (ALD) process. The gate electrode layer may include a gate barrier layer and a gate conductive layer sequentially stacked.

The gate electrode layer may be partially removed to form a gate electrode 480 in each of the second gaps 460. In an example embodiment of the present inventive concept, the gate electrode layer may be partially removed by a wet etching process.

In an example embodiment of the present inventive concept, the gate electrode 480 may extend in the second direction D2, and a plurality of gate electrodes 480 may be spaced apart from each other in the first direction D1 to form a gate electrode structure. Additionally, a plurality of gate electrode structures may be spaced apart from each other in the third direction D3 by the second opening 410. The gate electrode 480 may protrude more than the insulation pattern 315 toward the channel 365 in the horizontal direction.

A division layer may be formed on the blocking layer to fill the second opening 410, and the division layer and the blocking layer may be planarized until the upper surface of the fourth insulating interlayer 400 is exposed. An etch-back or chemical mechanical polishing (CMP) process may be employed to planarize the division layer and the blocking layer. Thus, the blocking layer may be transformed into a blocking pattern 470, and the division layer may form a division pattern 490 extending in the second direction D2 in the second opening 410.

Referring to FIGS. 4 and 5 again, a fifth insulating interlayer 500 may be formed on the fourth insulating interlayer 400, the division pattern 490 and the blocking pattern 470, and a contact plug 510 may be formed through the fourth and fifth insulating interlayers 400 and 500 to contact an upper surface of the capping pattern 395.

A bit line 520 contacting an upper surface of the contact plug 510 may be formed. In an example embodiment of the present inventive concept, the bit line 520 may extend in the third direction D3, and a plurality of bit lines 520 may be spaced apart from each other in the second direction D2. The bit line 520 may be connected to the memory channel structure through the contact plug 510.

Upper contact plugs contacting upper surface of the gate electrodes 480, respectively, and upper wirings for applying electrical signals to the upper contact plugs may be further formed to complete the fabrication of the semiconductor device.

Figure 17:
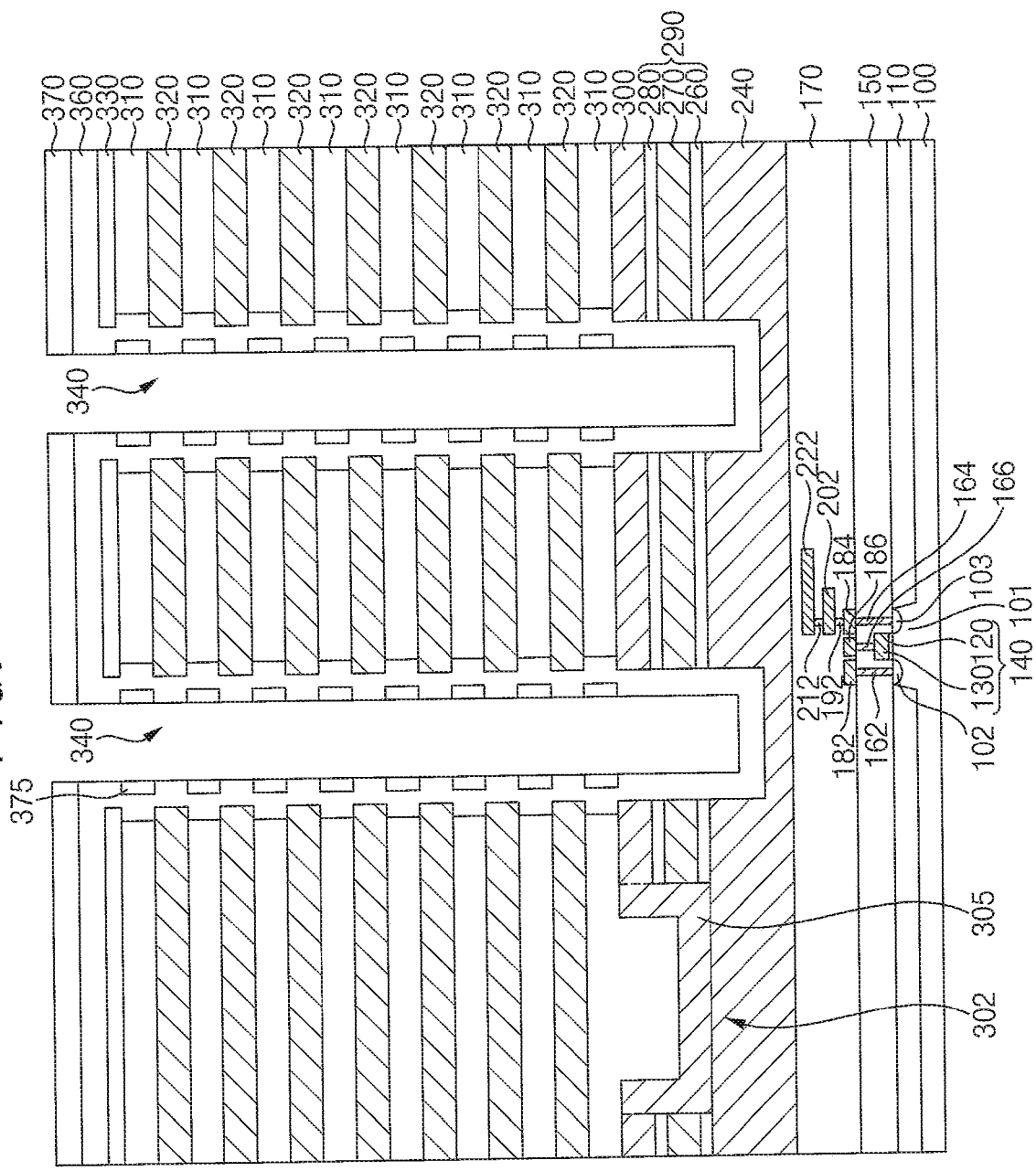
FIGS. 17 to 19 are cross-sectional views illustrating a method of manufacturing a semiconductor device in accordance with an example embodiment of the present inventive concept.
Figure 17:
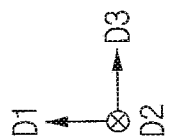
Figure 18:
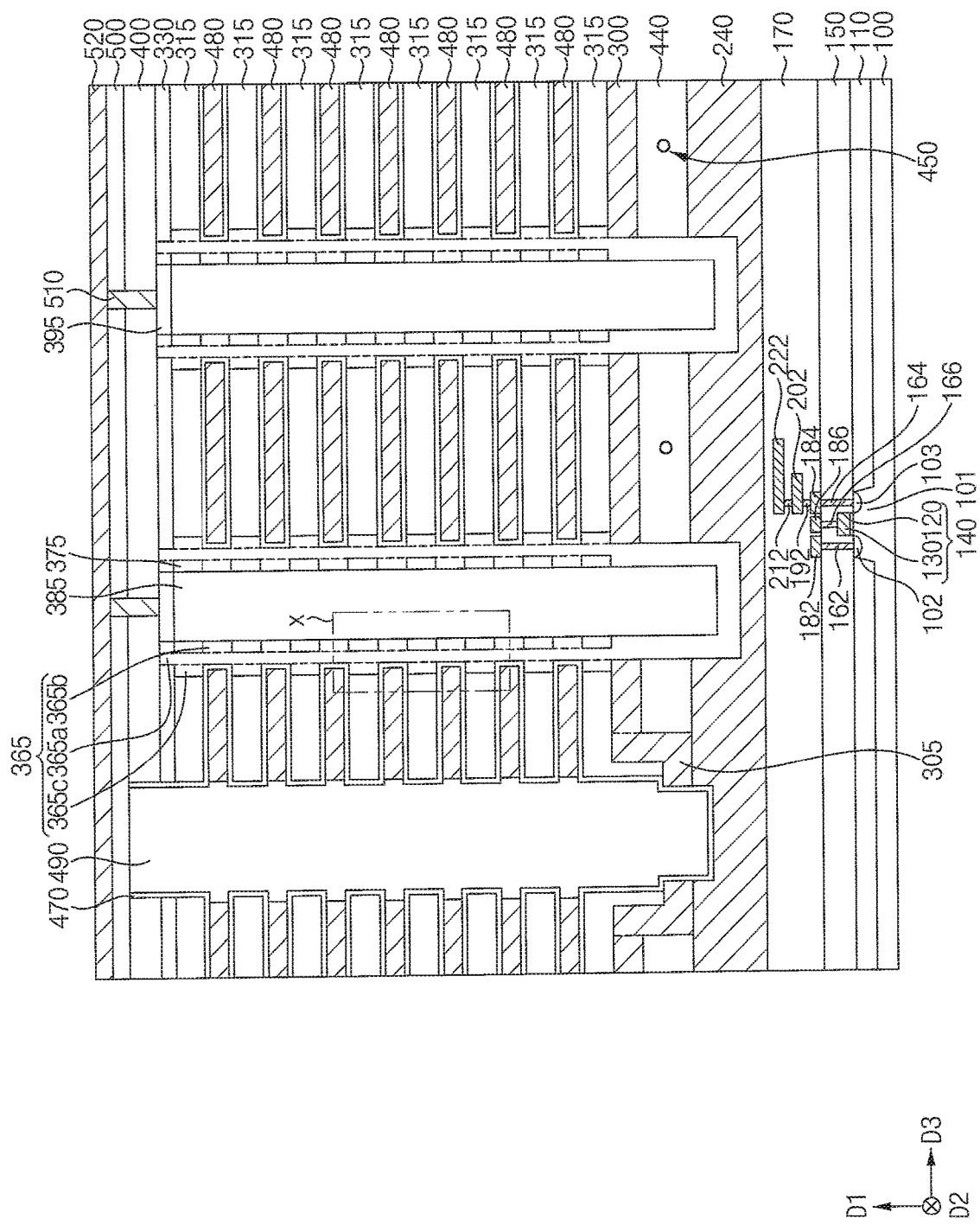
Figure 19:
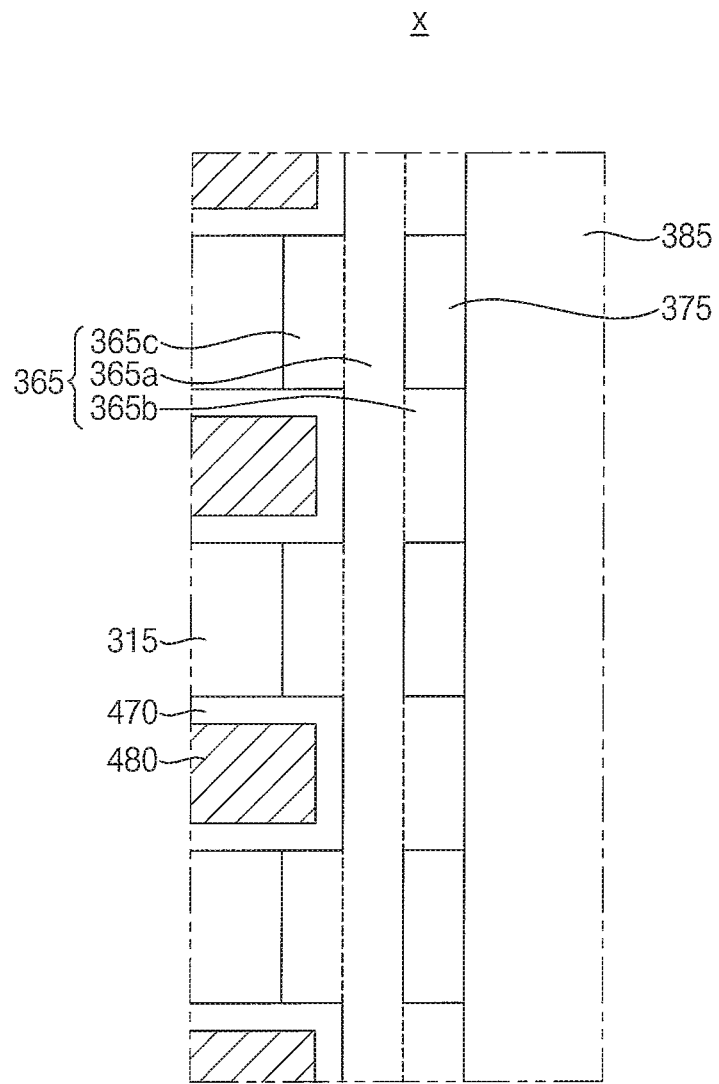

FIGS. 17 to 19 are cross-sectional views illustrating a method of manufacturing a semiconductor device in accordance with an example embodiment of the present inventive concept. This method may include processes substantially the same as or similar to those illustrated with reference to FIGS. 4 to 16, and repeated explanations thereof are omitted herein.

Referring to FIG. 17, processes substantially the same as or similar to those illustrated with reference to FIGS. 5 to 10 may be performed so that the channel layer 360 may be formed on the sidewall of the channel hole 340, the exposed upper surface of the CSP 240 and the upper surface of the third insulating interlayer 330 to fill the second recess 350, and the resistance layer 370 may be formed on the channel layer 360.

The resistance layer 370 may be anisotropically etched to form a resistance pattern 375 on the sidewall of the channel hole 340. A plurality of resistance pattern 375 may be spaced apart from each other in the first direction D1, and the resistance patterns 375 may overlap the insulation layers 310, respectively, in the horizontal direction. A portion of the resistance layer 370 on the upper surface of the channel layer 360 may remain.

Referring to FIGS. 18 and 19, processes substantially the same as or similar to those illustrated with reference to FIGS. 10 and 11 may be performed so that an upper portion of the filling pattern 385 may be removed to form the third recess, the capping layer may be formed on the filling pattern 385, the resistance pattern 375 and the third insulating interlayer 330 to fill the third recess, and the capping layer may be planarized until the upper surface of the third insulating interlayer 330 is exposed to form the capping pattern 395 contacting an upper inner sidewall of the channel 365. An etch-back or chemical mechanical polishing (CMP) process may be employed to planarize the division layer and the blocking layer.

Processes substantially the same as or similar to those illustrated with reference to FIGS. 12 to 16 and FIG. 4 may be performed to complete the fabrication of the semiconductor device.

The semiconductor device manufactured by the above processes may have following structural characteristics.

The memory channel structure may include the filling pattern 385 extending in the first direction D1, the resistance patterns 375 spaced apart from each other in the first direction D1 on the sidewall of the filling pattern 385, the channel 365 covering the resistance patterns 375 and extending in the first direction D1, and the capping pattern 395 on the filling pattern 385 and the channel 365.

Referring to FIG. 19, in an example embodiment of the present inventive concept, a plurality of third protrusion portions 365*b* may be spaced apart from each other in the first direction D1, and the third protrusion portions 365*b* may respectively overlap the gate electrodes 480 in the horizontal direction. The third protrusion portion 365*b* may be interposed between and overlapped with two adjacent resistance patterns 375 in the first direction D1. A plurality of fourth protrusion portions 365*c* may be spaced apart from each other in the first direction D1, and the fourth protrusion portions 365*c* may respectively overlap the insulation patterns 315 and the resistance patterns 375 in the horizontal direction.

In an example embodiment of the present inventive concept, the filling pattern 385 may have a pillar shape extending in the first direction D1.

As illustrated above, a plurality of resistance patterns 375 may be spaced apart from each other in the first direction D1. Thus, Joule's heat provided to the resistance pattern 375 of the selected memory cell may not be transferred to the resistance pattern 375 of the non-selected memory cell adjacent to the selected memory cell in the first direction D1. Thus, data may be stored only in the selected memory cell, and the writing operation of the semiconductor device may be enhanced.

Figure 20:
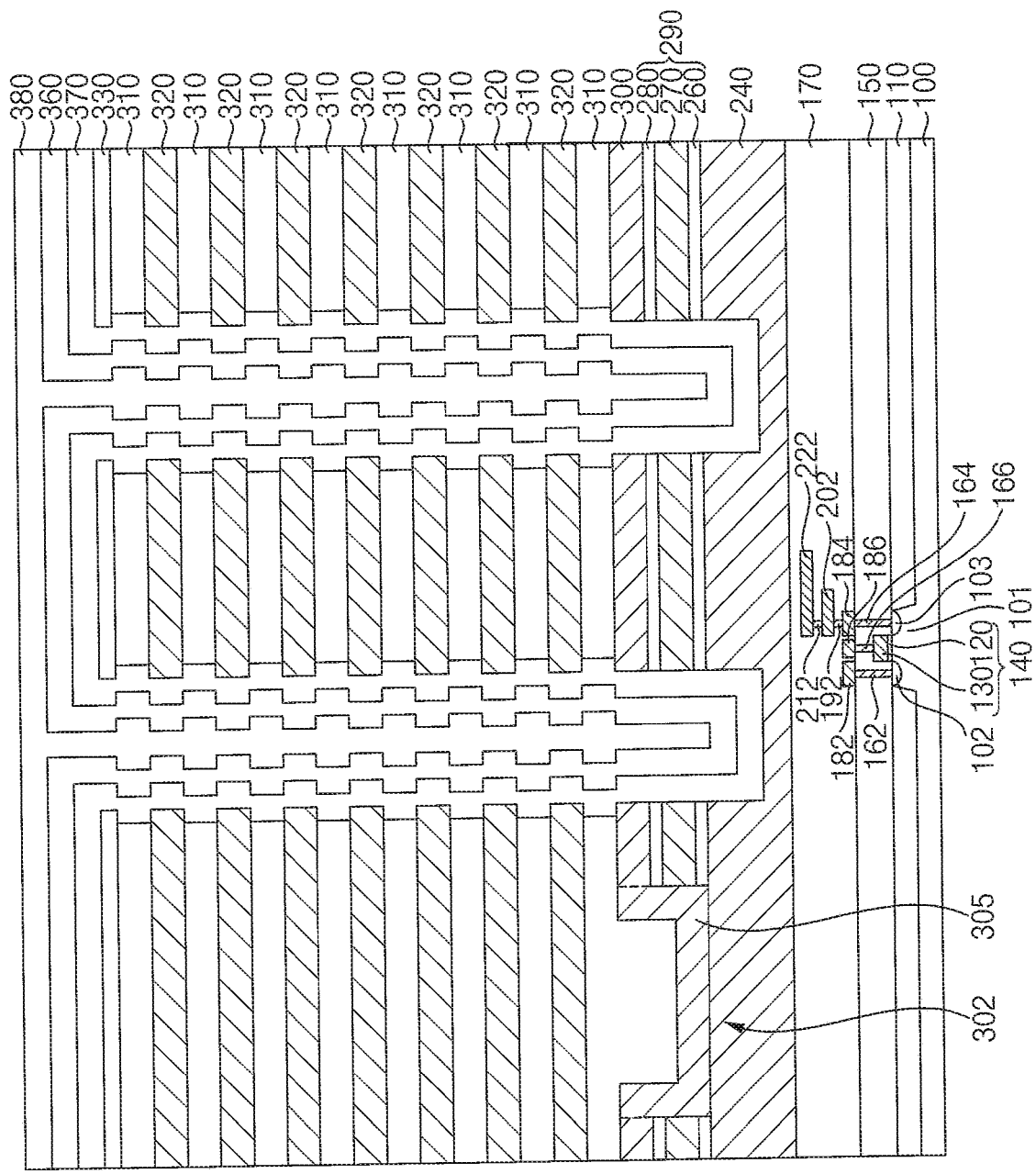
FIGS. 20 to 21 are cross-sectional views illustrating a method of manufacturing a semiconductor device in accordance with an example embodiment of the present inventive concept.
Figure 21:
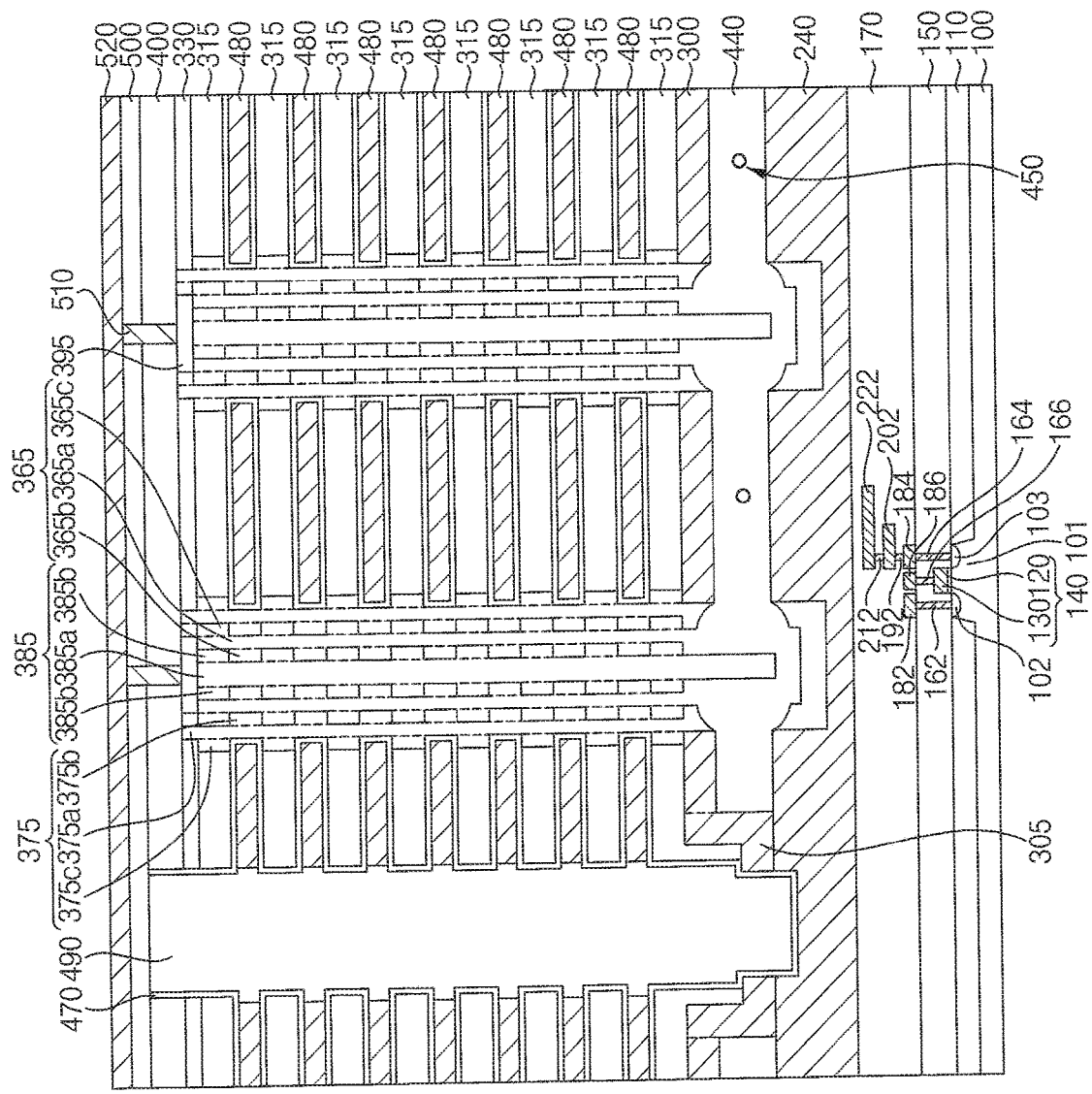
Figure 21:
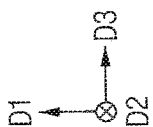

FIGS. 20 to 21 are cross-sectional views illustrating a method of manufacturing a semiconductor device in accordance with an example embodiment of the present inventive concept. This method may include processes substantially the same as or similar to those illustrated with reference to FIGS. 4 to 16, and repeated explanations thereof are omitted herein.

Referring to FIG. 20, processes substantially the same as or similar to those illustrated with reference to FIGS. 5 to 10 may be performed so that the resistance layer 370 may be formed on the sidewall of the channel hole 340, the exposed upper surface of the CSP 240 and the upper surface of the third insulating interlayer 330 to fill the second recess 350, and the channel layer 360 may be formed on the resistance layer 370.

A filling layer 380 may be formed on the channel layer 360 to fill a remaining portion of the channel hole 340.

Referring to FIG. 21, processes substantially the same as or similar to those illustrated with reference to FIG. 11 may be performed so that the filling pattern 385, the channel 365 and the resistance pattern 375 may be formed in the channel hole 340.

The resistance pattern 375 may include the first vertical extension portion 375*a* on the outer sidewall of the channel 365 and extending in the first direction D1, the first protrusion portion 375*b* on the inner sidewall of the first vertical extension portion 375*a* and protruding in the horizontal direction, and the second protrusion portion 375*c* on the outer sidewall of the first vertical extension portion 375*a* and protruding in the horizontal direction, which may not overlap the first protrusion portion 375*b* in the horizontal direction.

Upper portions of the filling pattern 385 and the channel 365 may be removed to form the third recess, a capping layer may be formed on the filling pattern 385, the channel 365, the resistance pattern 375 and the third insulating interlayer 330 to fill the third recess, and the capping layer may be planarized until an upper surface of the third insulating interlayer 330 is exposed to form the capping pattern 395 contacting the inner upper sidewall of the resistance pattern 375. An etch-back or chemical mechanical polishing (CMP) process may be employed to planarize the capping layer.

Processes substantially the same as or similar to those illustrated with reference to FIGS. 12 to 16 and FIG. 4 may be performed to complete the fabrication of the semiconductor device.

The semiconductor device manufactured by the above processes may have following structural characteristics.

The memory channel structure may include the filling pattern 385 extending in the first direction D1, the channel 365 on the sidewall of the filling pattern 385 and extending in the first direction D1, the resistance pattern 375 on the outer sidewall of the channel 365 and extending in the first direction D1, and the capping pattern 395 on the filling pattern 385, the channel 365 and the resistance pattern 375. For example, the resistance pattern 375 may surround the channel 365.

Figure 22:
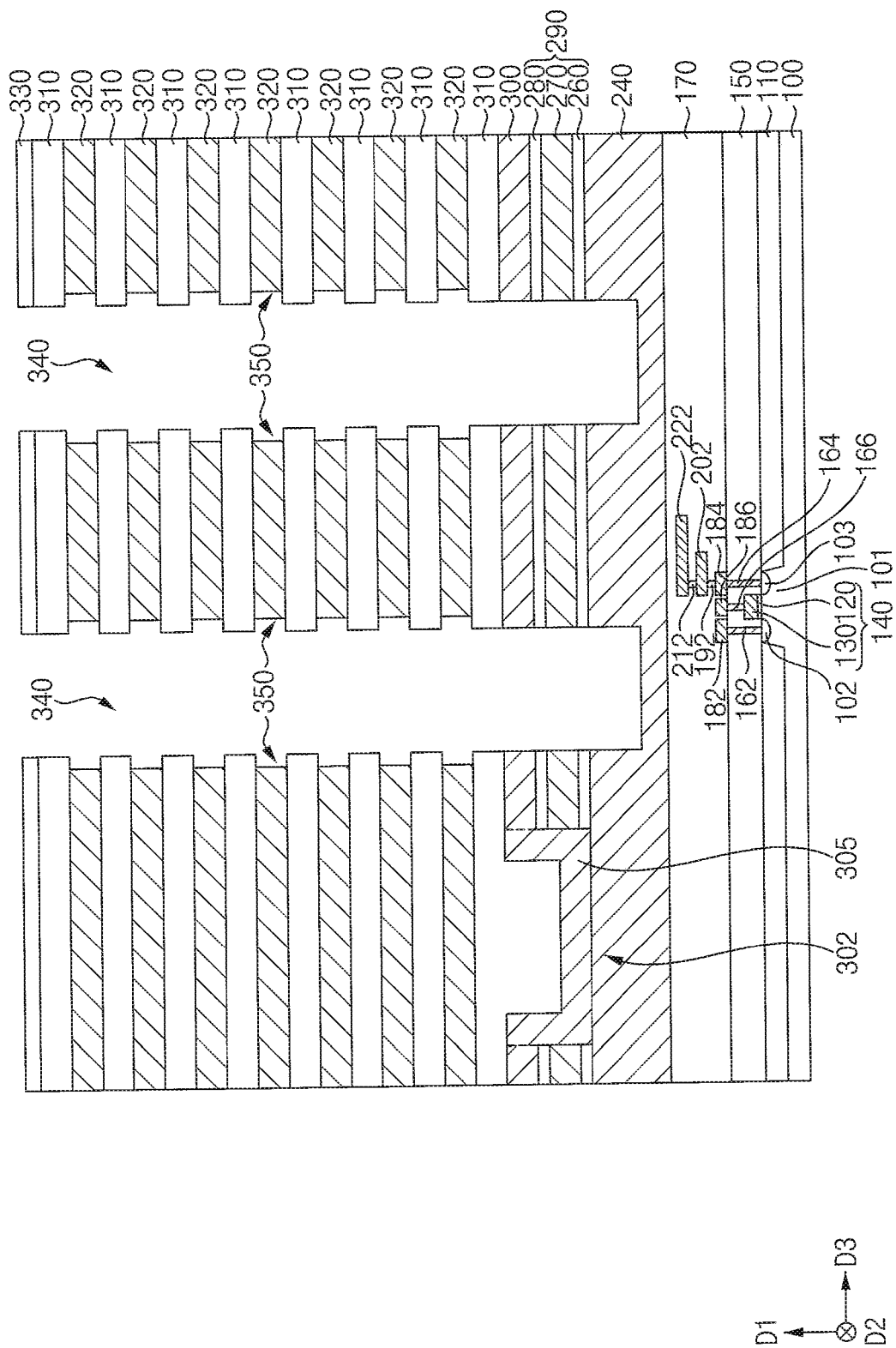
FIGS. 22 to 24 are cross-sectional views illustrating a method of manufacturing a semiconductor device in accordance with an example embodiment of the present inventive concept.
Figure 23:
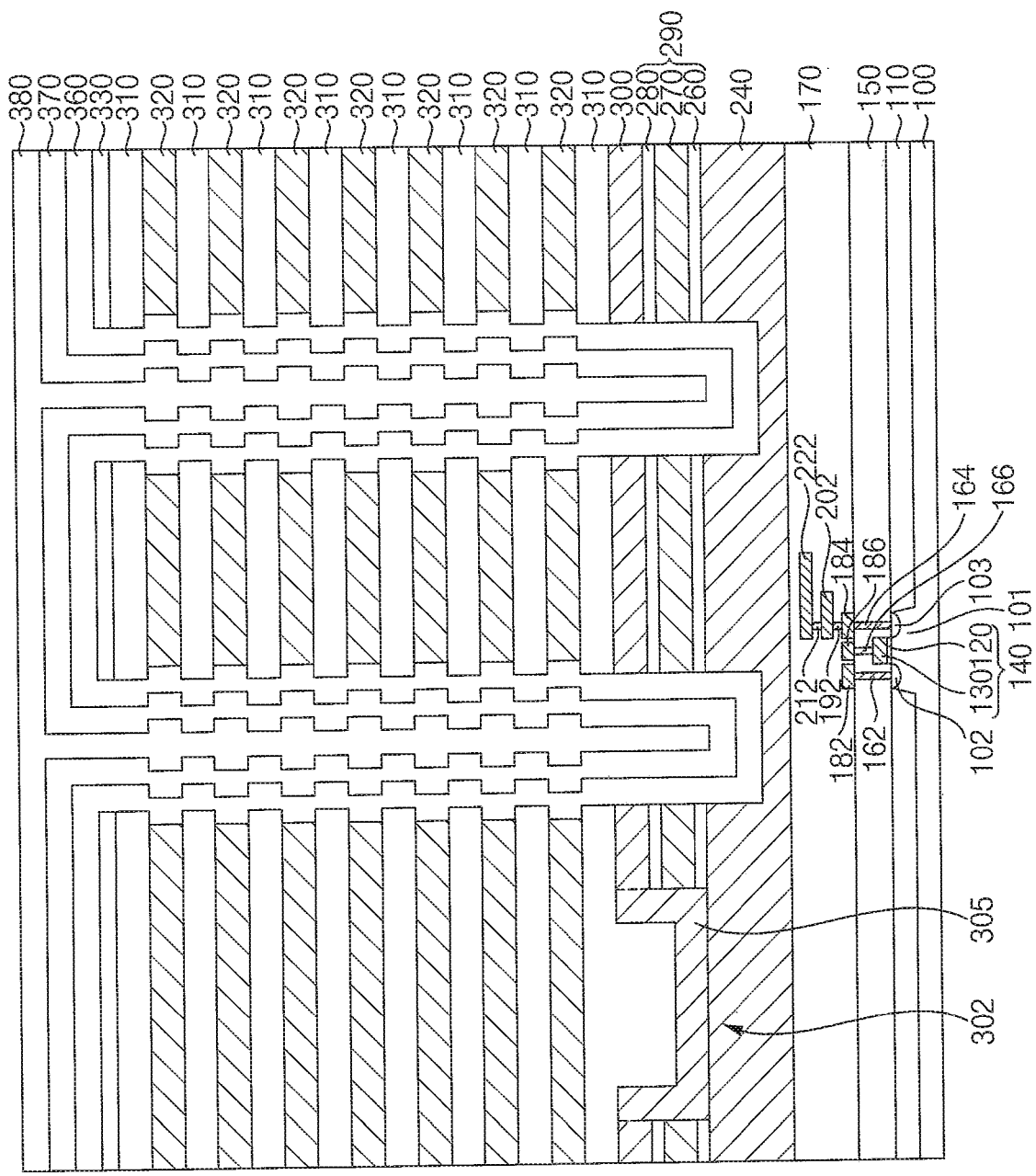
Figure 24:
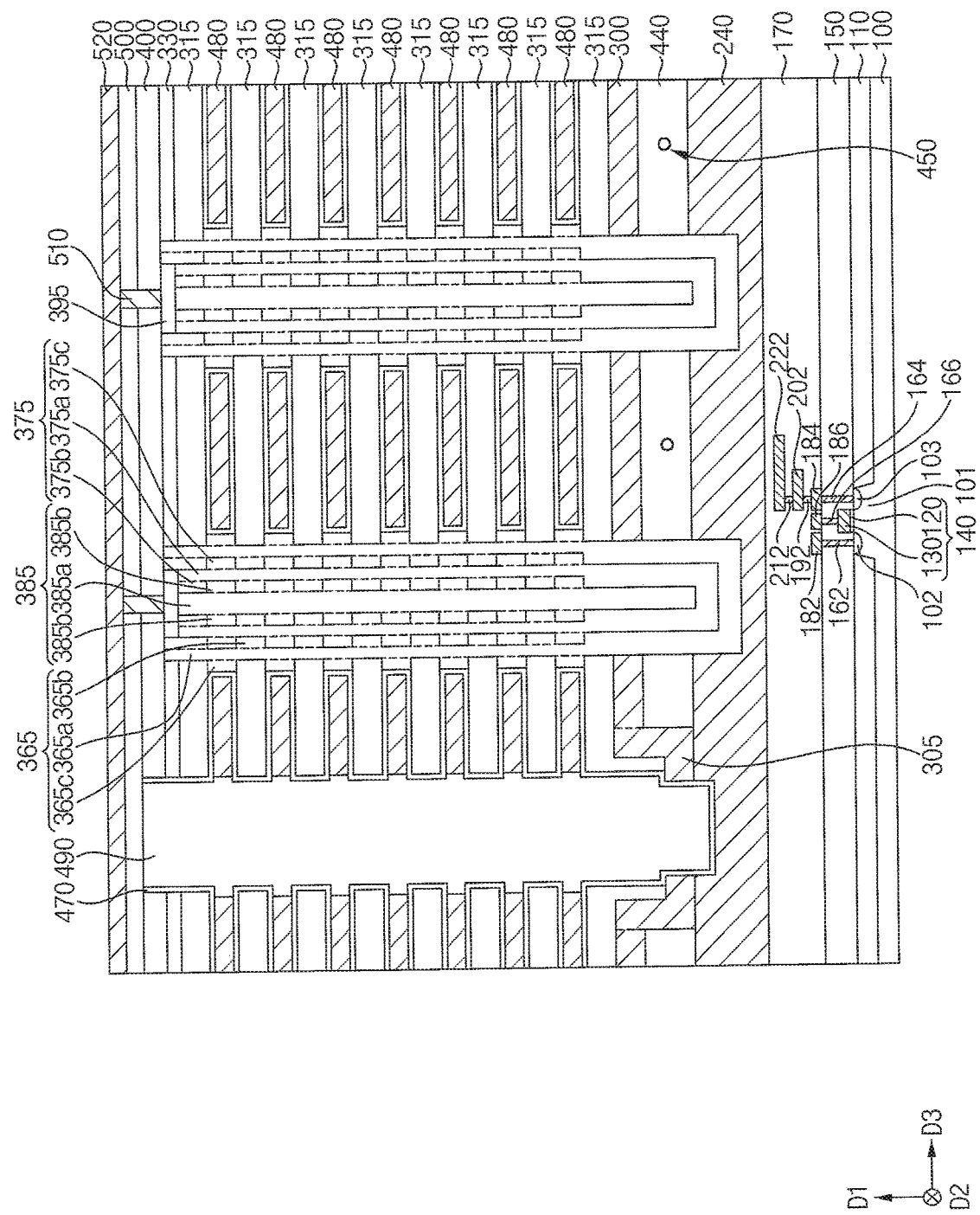

FIGS. 22 to 24 are cross-sectional views illustrating a method of manufacturing a semiconductor device in accordance with an example embodiment of the present inventive concept. This method may include processes substantially the same as or similar to those illustrated with reference to FIGS. 4 to 16, and repeated explanations thereof are omitted herein.

Referring to FIG. 22, processes substantially the same as or similar to those illustrated with reference to FIGS. 5 to 9 may be performed so that a portion of the fourth sacrificial layer 320 exposed by the channel hole 340 may be removed to form the second recess 350. Thus, the insulation layer 310 may protrude more than the fourth sacrificial layer 320 in the horizontal direction toward the channel hole 340.

Referring to FIG. 23, processes substantially the same as or similar to those illustrated with reference to FIG. 10 may be performed so that the channel layer 360 may be formed on the sidewall of the channel hole 340, the exposed upper surface of the CSP 240 and the upper surface of the third insulating interlayer 330, and the resistance layer 370 may be formed on the channel layer 360. Sidewalls of portions of the channel layer 360 and the resistance layer 370 in the channel hole 340 may have a shape substantially the same as a shape of sidewalls of the second recesses 350 and the insulation layers 310.

Referring to FIG. 24, processes substantially the same as or similar to those illustrated with reference to FIGS. 11 to 16 and FIG. 4 may be performed to complete the fabrication of the semiconductor device.

The semiconductor device manufactured by the above processes may have following structural characteristics.

In an example embodiment of the present inventive concept, the insulation pattern 315 may protrude more than the gate electrode 480 in the horizontal direction toward the channel 365.

In an example embodiment of the present inventive concept, the first protrusion portions 375*b* of the resistance pattern 375 may overlap the insulation patterns 315, respectively, in the horizontal direction, and the second protrusion portions 375c of the resistance pattern 375 may overlap the gate electrodes 480, respectively, in the horizontal direction.

In an example embodiment of the present inventive concept, the third protrusion portions 365b of the channel 365 may overlap the insulation patterns 315 and the first protrusion portion 375b of the resistance pattern 375 in the horizontal direction, and the fourth protrusion portions 365c of the channel 365 may overlap the gate electrodes 480 and the second protrusion portion 375c of the resistance pattern 375 in the horizontal direction. The third protrusion portion 365b may be interposed between and overlapped with two adjacent second protrusion portions 375C of the resistance pattern 375 in the first direction D1.

In an example embodiment of the present inventive concept, the fifth protrusion portion 385b of the filling pattern 385 may overlap the first portion of the resistance pattern 375 and the third portion of the channel 365 in the horizontal direction.

As illustrated above, since the resistance pattern 375 may include the first and second protrusion portions 375b and 375c, the route of heat transfer may be enlarged, and thus an amount of heat transferred from the selected memory cell to the neighboring non-selected memory cell may decrease. Accordingly, even Joule's heat is provided to the resistance pattern 375 of the selected memory cell, the resistance pattern 375 of the non-selected memory cell may be still in an amorphous state, so that no current may flow through the resistance pattern 375 of the non-selected memory cell. As a result, data may be stored only in the selected memory cell, and the wiring operation of the semiconductor device may be enhanced.

Figure 25:
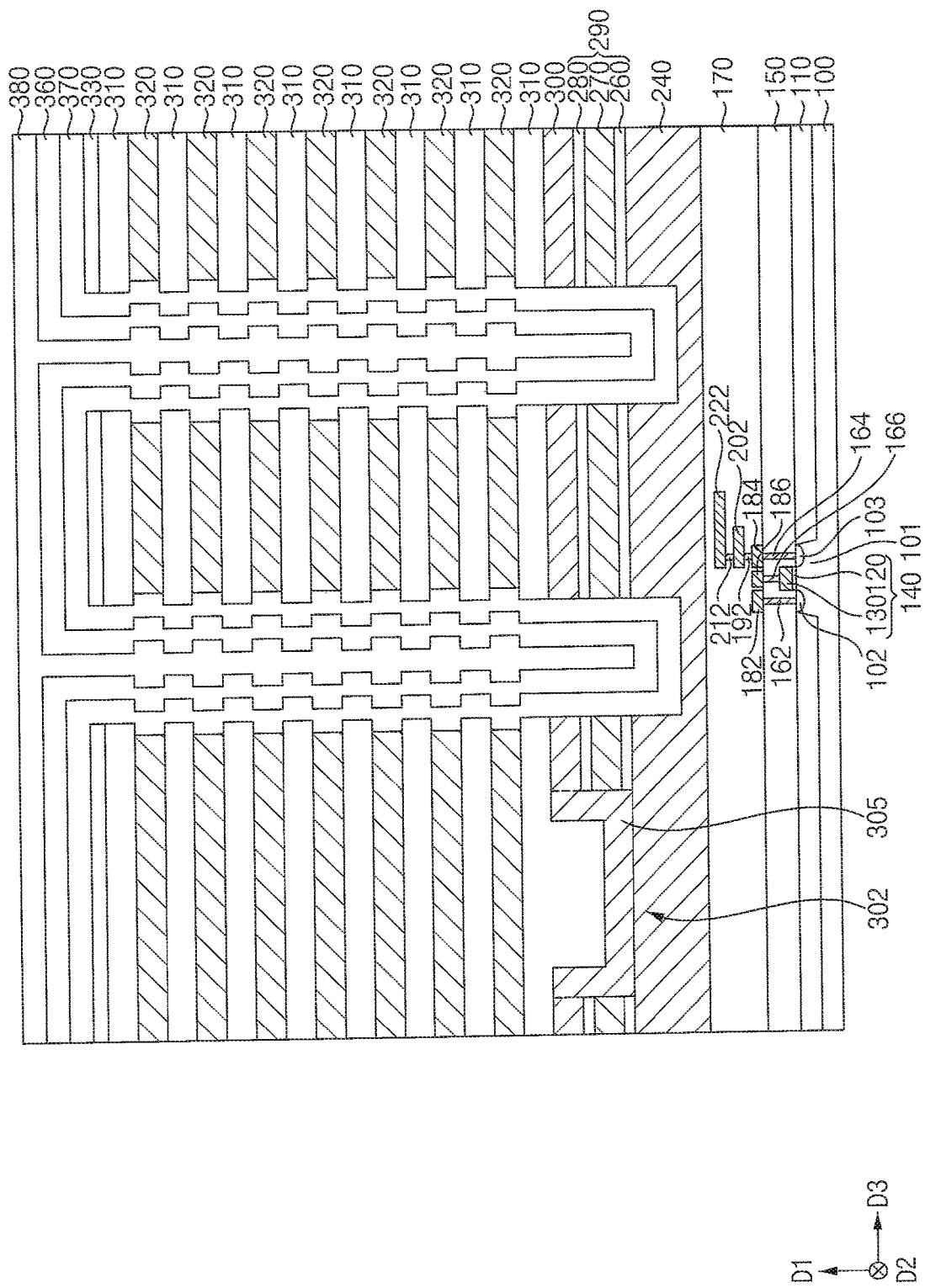
FIGS. 25 and 26 are cross-sectional views illustrating a method of manufacturing a semiconductor device in accordance with an example embodiment of the present inventive concept.
Figure 26:
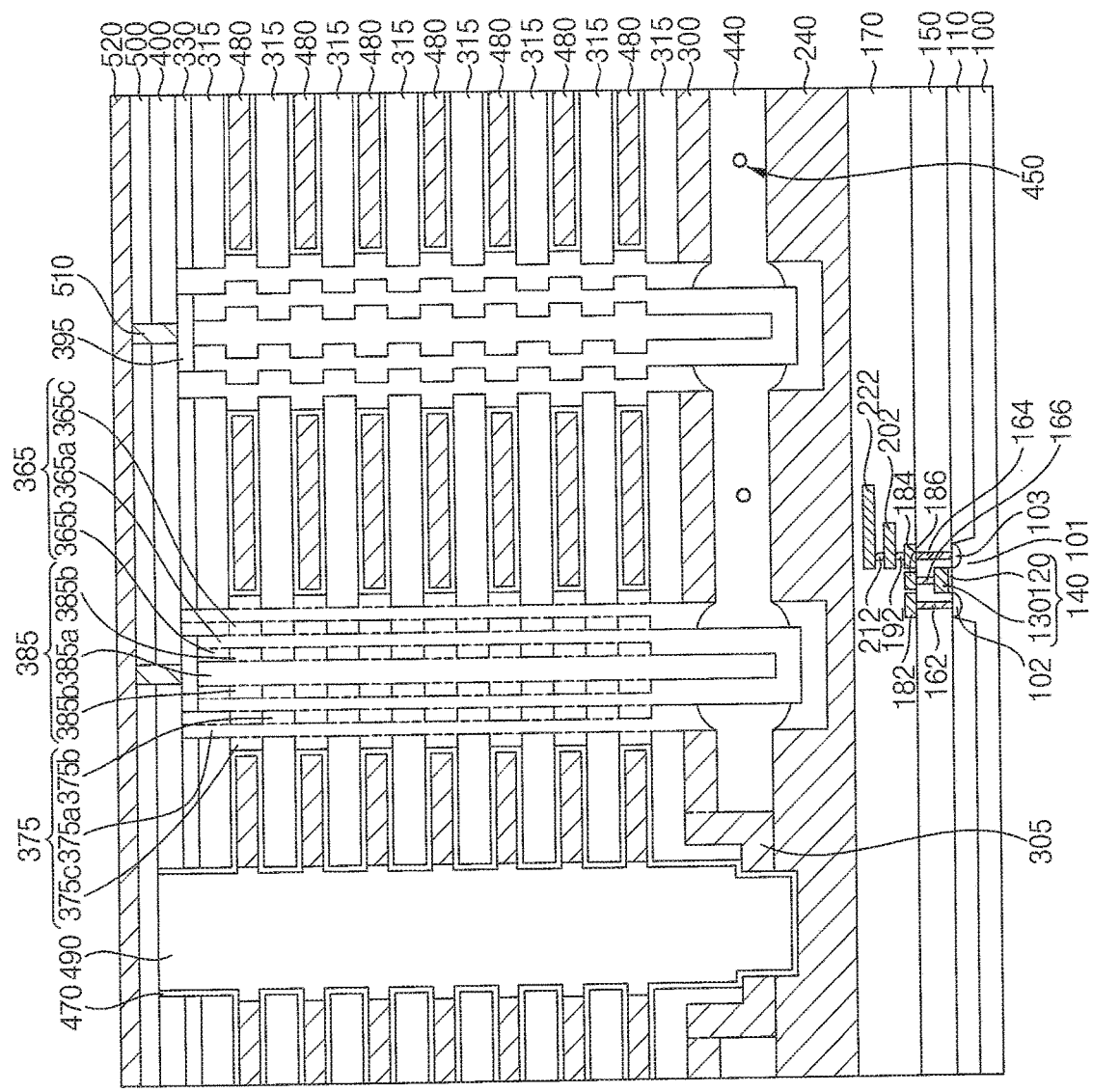

FIGS. 25 and 26 are cross-sectional views illustrating a method of manufacturing a semiconductor device in accordance with an example embodiment of the present inventive concept. This method may include processes substantially the same as or similar to those illustrated with reference to FIGS. 5 to 8 and FIGS. 22 to 24, and repeated explanations thereof are omitted herein.

Referring to FIG. 25, processes substantially the same as or similar to those illustrated with reference to FIGS. 5 to 8 and FIGS. 22 and 23 may be performed so that the resistance layer 370 may be formed on the sidewall of the channel hole 340, the exposed upper surface of the CSP 240 and the upper surface of the third insulating interlayer 330 to fill the second recess 350, and the channel layer 360 may be formed on the resistance layer 370.

The filling layer 380 may be formed on the channel layer 360 to fill a remaining portion of the channel hole 340.

Referring to FIG. 26, the filling pattern 385, the channel 365 and the resistance pattern 375 may be formed in the channel hole 340.

The resistance pattern 375 may include the first vertical extension portion 375a on the outer sidewall of the channel 365 and extending in the first direction D1, the first protrusion portion 375b on the inner sidewall of the first vertical extension portion 375a and protruding in the horizontal direction, and the second protrusion portion 375c on the outer sidewall of the first vertical extension portion 375a and protruding in the horizontal direction, which may not overlap the first protrusion portion 375b in the horizontal direction.

Upper portions of the filling pattern 385 and the channel 365 may be removed to form a third recess, the capping layer may be formed on the filling pattern 385, the channel 365, the resistance pattern 375 and the third insulating interlayer 330, and the capping layer may be planarized until the upper surface of the third insulating interlayer 330 is exposed to form the capping pattern 395 contacting the upper inner sidewall of the resistance pattern 375. An etch-back or chemical mechanical polishing (CMP) process may be employed to planarize the capping layer.

Processes substantially the same as or similar to those illustrated with reference to FIG. 24 may be performed to complete the fabrication of the semiconductor device.

The memory channel structure may include the filling pattern 385 extending in the first direction D1, the channel 365 on the sidewall of the filling pattern 385 and extending in the first direction D1, the resistance pattern 375 on the outer sidewall of the channel 365 and extending in the first direction D1, and the capping pattern 395 on the filling pattern 385, the channel 365 and the resistance pattern 375. For example, the resistance pattern 375 may surround the channel 365.

While example embodiments have been particularly shown and described, it will be understood by one of ordinary skill in the art that variations in form and detail may be made therein without departing from the spirit and scope of the present inventive concept as defined in the appended claims.

What is claimed is:

1. A semiconductor device comprising:
   gate electrodes on a substrate, the gate electrodes being spaced apart from each other in a vertical direction substantially perpendicular to an upper surface of the substrate;
   a channel extending through the gate electrodes in the vertical direction on the substrate; and
   a resistance pattern including a phase-changeable material, the resistance pattern including:
      a first vertical extension portion on a sidewall of the channel, the first vertical extension portion extending in the vertical direction;
      a first protrusion portion on an inner sidewall of the first vertical extension portion, the first protrusion portion protruding in a horizontal direction substantially parallel to the upper surface of the substrate; and
      a second protrusion portion on an outer sidewall of the first vertical extension portion, the second protrusion portion protruding in the horizontal direction and not overlapping the first protrusion portion in the horizontal direction.

2. The semiconductor device of claim 1, wherein the resistance pattern includes a chalcogenide-based material.

3. The semiconductor device of claim 1, wherein the first protrusion portion of the resistance pattern is one of a plurality of first protrusion portions spaced apart from each other in the vertical direction, and the plurality of first protrusion portions overlap the gate electrodes, respectively, in the horizontal direction.

4. The semiconductor device of claim 3, further comprising insulation patterns between the gate electrodes.

5. The semiconductor device of claim 4, wherein the second protrusion portion of the resistance pattern is one of a plurality of second protrusion portions spaced apart from each other in the vertical direction, and the plurality of second protrusion portions overlap the insulation patterns, respectively, in the horizontal direction.

6. The semiconductor device of claim 4, wherein the gate electrodes protrude more than the insulation patterns in the horizontal direction toward the channel.

7. The semiconductor device of claim 1, further comprising insulation patterns between the gate electrodes,
   wherein the first protrusion portion of the resistance pattern is one of a plurality of first protrusion portions spaced apart from each other in the vertical direction, and the plurality of first protrusion portions overlap the insulation patterns, respectively, in the horizontal direction.

8. The semiconductor device of claim 7, wherein the second protrusion portion of the resistance pattern is one of a plurality of second protrusion portions spaced apart from each other in the vertical direction, and the plurality of second protrusion portions overlap the gate electrodes, respectively, in the horizontal direction.

9. The semiconductor device of claim 7, wherein the insulation patterns protrude more than the gate electrodes in the horizontal direction toward the channel.

10. The semiconductor device of claim 1, wherein the resistance pattern is disposed on an inner sidewall of the channel.

11. The semiconductor device of claim 1, wherein the resistance pattern is disposed on an outer sidewall of the channel.

12. The semiconductor device of claim 1, wherein the channel includes:
   a second vertical extension portion extending in the vertical direction;
   a third protrusion portion on an inner sidewall of the second vertical extension portion, the third protrusion portion protruding in the horizontal direction; and
   a fourth protrusion portion on an outer sidewall of the second vertical extension portion, the fourth protrusion portion protruding in the horizontal direction and not overlapping the third protrusion portion in the horizontal direction.

13. The semiconductor device of claim 1, further comprising a filling pattern on an inner sidewall of the resistance pattern,
   wherein the filling pattern includes:
   a third vertical extension portion extending in the vertical direction; and
   a fifth protrusion portion on a sidewall of the third vertical extension portion, the fifth protrusion portion overlapping the second protrusion portion of the resistance pattern in the horizontal direction.

14. The semiconductor device of claim 13, wherein the first protrusion portion of the resistance pattern overlaps the fifth protrusion portion of the filling pattern in the vertical direction.

15. A semiconductor device comprising:
   gate electrodes on a substrate, the gate electrodes being spaced apart from each other in a vertical direction substantially perpendicular to an upper surface of the substrate;
   insulation patterns between the gate electrodes, respectively; and
   a memory channel structure extending through the gate electrodes and the insulation patterns in the vertical direction on the substrate,
   wherein
   the memory channel structure includes:
   a filling pattern extending in the vertical direction;
   a resistance pattern on a sidewall of the filling pattern, the resistance pattern extending in the vertical direction; and
   a channel on a sidewall of the resistance pattern, the channel extending in the vertical direction,
   a width of the memory channel structure in a horizontal direction substantially parallel to the upper surface of the substrate varies periodically in the vertical direction, and
   a first portion of the resistance pattern facing a corresponding one of the gate electrodes in the horizontal direction has a width substantially equal to a width of a second portion of the resistance pattern facing a corresponding one of the insulation patterns in the horizontal direction.

16. The semiconductor device of claim 15, wherein the filling pattern includes:
   a vertical extension portion extending in the vertical direction; and
   protrusion portions spaced apart from each other on a sidewall of the vertical extension portion in the vertical direction, the protrusion portions protruding in the horizontal direction.

17. The semiconductor device of claim 16, wherein the second portion of the resistance pattern overlaps the protrusion portions of the filling pattern in the horizontal direction.

18. The semiconductor device of claim 16, wherein the first portion of the resistance pattern overlaps the protrusion portions of the filling pattern in the vertical direction.

19. The semiconductor device of claim 15, wherein a portion of the channel facing a corresponding one of the gate electrodes in the horizontal direction has a width substantially equal to a width of a portion of the channel facing a corresponding one of the insulation patterns in the horizontal direction.

20. A semiconductor device comprising:
   a lower circuit pattern on a substrate;
   a common source plate (CSP) over the lower circuit pattern;
   gate electrodes spaced apart from each other on the CSP in a vertical direction substantially perpendicular to an upper surface of the substrate;
   insulation patterns between the gate electrodes, respectively; and
   a memory channel structure extending through the gate electrodes and the insulation patterns in the vertical direction on the CSP,
   wherein the memory channel structure includes:
   a filling pattern extending in the vertical direction;
   a resistance pattern on a sidewall of the filling pattern, the resistance pattern extending in the vertical direction; and
   a channel on a sidewall of the resistance pattern, the channel extending in the vertical direction,
   a width of the memory channel structure in a horizontal direction substantially parallel to the upper surface of the substrate varies periodically in the vertical direction, and
   a portion of the resistance pattern facing a corresponding one of the gate electrodes in the horizontal direction has a width substantially equal to a width of a portion of the resistance pattern facing a corresponding one of the insulation patterns in the horizontal direction.

* * * * *